United States Patent
Lee

(10) Patent No.: US 12,284,862 B2
(45) Date of Patent: Apr. 22, 2025

(54) TRANSPARENT DISPLAY DEVICE

(71) Applicant: LG Display Co., Ltd., Seoul (KR)

(72) Inventor: Seongku Lee, Paju-si (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/313,974

(22) Filed: May 8, 2023

(65) Prior Publication Data
US 2023/0284472 A1 Sep. 7, 2023

Related U.S. Application Data

(62) Division of application No. 16/938,451, filed on Jul. 24, 2020, now Pat. No. 11,683,946.

(30) Foreign Application Priority Data

Sep. 2, 2019 (KR) .................. 10-2019-0108401

(51) Int. Cl.
*H01L 51/52* (2006.01)
*H10K 50/814* (2023.01)
(Continued)

(52) U.S. Cl.
CPC ......... *H10K 50/816* (2023.02); *H10K 50/814* (2023.02); *H10K 50/818* (2023.02);
(Continued)

(58) Field of Classification Search
CPC .. H10K 50/816; H10K 50/814; H10K 50/818; H10K 50/824; H10K 50/844;
(Continued)

(56) References Cited

U.S. PATENT DOCUMENTS 8,698,189 B2 * 4/2014 Park .............. H10K 59/131
257/85
2003/0227021 A1 * 12/2003 Yamazaki .......... H10K 59/878
438/22

(Continued)

FOREIGN PATENT DOCUMENTS

CN 1432853 A 7/2003
KR 10-2010-0000408 A 1/2010

(Continued)

OTHER PUBLICATIONS

Korean Office Action dated Jul. 4, 2023 issued in Patent Application No. 10-2019-0108401 w/English Translation (16 pages).

(Continued)

*Primary Examiner* — Sheikh Maruf
(74) *Attorney, Agent, or Firm* — Fish & Richardson P.C.

(57) ABSTRACT

A transparent display device includes a substrate in which a sub-pixel having an organic light emitting diode and an auxiliary sub-pixel adjacent to the sub-pixel and having an auxiliary organic light emitting diode are placed, wherein the organic light emitting diode includes a 1-1 electrode in which a transparent conductive layer and a reflective layer are laminated, and the auxiliary organic light emitting diode includes a 1-2 electrode in which the transparent conductive layer is extended and provided.

15 Claims, 17 Drawing Sheets

(51) Int. Cl.
*H10K 50/816* (2023.01)
*H10K 50/818* (2023.01)
*H10K 50/824* (2023.01)
*H10K 50/844* (2023.01)
*H10K 59/131* (2023.01)

(52) U.S. Cl.
CPC ......... *H10K 50/824* (2023.02); *H10K 50/844* (2023.02); *H10K 59/131* (2023.02)

(58) Field of Classification Search
CPC ........... H10K 59/131; H10K 59/80518; H10K 59/12; H10K 59/126; H10K 59/351; H10K 59/80524; H10K 2102/3031; H10K 59/121; H10K 50/11; H01L 51/5215; H01L 27/3276; H01L 51/5212; H01L 51/5218; H01L 51/5228; H01L 51/5253; H01L 27/3213; H01L 27/3272; H01L 2251/5323; H01L 27/3244; H01L 27/326; H01L 51/5234; H01L 51/5203; H01L 51/5012; H01L 51/52
USPC .......................................................... 257/40
See application file for complete search history.

(56) References Cited

U.S. PATENT DOCUMENTS

| | | | | |
|---|---|---|---|---|
| 2008/0079005 A1* | 4/2008 | Tseng | .................. | H10K 59/126 345/82 |
| 2009/0009069 A1* | 1/2009 | Takata | ................. | H10K 59/122 445/24 |
| 2009/0315455 A1* | 12/2009 | Wang | ................... | H10K 59/125 313/504 |
| 2011/0205198 A1* | 8/2011 | Jeong | ....................... | H10K 50/81 345/82 |
| 2011/0215712 A1* | 9/2011 | Hong | .................. | H10K 59/121 313/504 |
| 2011/0221661 A1* | 9/2011 | Yoon | .................... | H10K 59/131 345/76 |
| 2012/0049206 A1* | 3/2012 | Choi | .................... | H10K 59/121 257/E33.062 |
| 2012/0074435 A1 | 3/2012 | Ha | | |
| 2012/0104395 A1* | 5/2012 | Kim | ..................... | H10K 59/131 438/34 |
| 2013/0001563 A1* | 1/2013 | Park | ..................... | H10K 59/131 257/E33.053 |
| 2013/0119392 A1* | 5/2013 | Park | ..................... | H10K 59/121 438/34 |
| 2013/0277709 A1* | 10/2013 | Yamazaki | ......... | H01L 29/78645 257/99 |
| 2013/0334503 A1* | 12/2013 | Seo | ...................... | H10K 59/131 257/40 |
| 2014/0027726 A1* | 1/2014 | Choi | ..................... | H10K 59/35 438/34 |
| 2014/0042394 A1* | 2/2014 | Lee | ....................... | H10K 71/20 438/34 |
| 2014/0312323 A1 | 10/2014 | Park et al. | | |
| 2015/0021564 A1 | 1/2015 | Hong et al. | | |
| 2015/0021580 A1* | 1/2015 | Ha | ....................... | H10K 50/828 257/40 |
| 2015/0097171 A1 | 4/2015 | Kim et al. | | |
| 2015/0144904 A1 | 5/2015 | Jeong et al. | | |
| 2015/0147831 A1 | 5/2015 | Lee et al. | | |
| 2015/0206929 A1* | 7/2015 | Sato | .................... | H10K 59/1216 257/40 |
| 2016/0351636 A1 | 12/2016 | Lee et al. | | |
| 2017/0133620 A1 | 5/2017 | Lee et al. | | |
| 2017/0170246 A1 | 6/2017 | Im et al. | | |
| 2017/0263866 A1 | 9/2017 | Kim et al. | | |
| 2017/0277288 A1 | 9/2017 | Choi et al. | | |
| 2017/0278910 A1* | 9/2017 | Choi | ...................... | H10K 71/00 |
| 2017/0365649 A1* | 12/2017 | Kim | ................... | H10K 59/1213 |
| 2018/0145123 A1* | 5/2018 | Kim | ..................... | G09G 3/3225 |
| 2018/0226606 A1 | 8/2018 | Lee et al. | | |
| 2019/0096982 A1* | 3/2019 | Hong | .................... | H10K 59/805 |
| 2019/0348627 A1* | 11/2019 | Lee | ....................... | H10K 50/824 |
| 2021/0083028 A1* | 3/2021 | Zhou | .................... | H10K 59/124 |
| 2021/0335961 A1* | 10/2021 | Hou | ..................... | H10K 59/176 |
| 2021/0408437 A1* | 12/2021 | Du | ........................ | H10K 50/822 |

FOREIGN PATENT DOCUMENTS

| | | |
|---|---|---|
| KR | 10-2011-0097046 A | 8/2011 |
| KR | 10-2012-003136 A | 4/2012 |
| KR | 10-2012-0031365 A | 4/2012 |
| KR | 10-2016-0062661 A | 6/2016 |
| KR | 10-2017-0027362 A | 3/2017 |
| KR | 10-2019-0048557 A | 5/2019 |

OTHER PUBLICATIONS

Chinese Office Action dated Mar. 15, 2024 issued in Patent Application No. 202010788822.6 w/English Translation (16 pages).
Office Action in Chinese Appln. No. 202010788822.6, mailed on Oct. 30, 2024, 8 pages (with English translation).

* cited by examiner

TRANSPARENT DISPLAY DEVICE

CROSS-REFERENCE TO RELATED APPLICATIONS

This application is a divisional of U.S. patent application Ser. No. 16/938,451, filed on Jul. 24, 2020, which claims the priority of Korean Patent Application No. 10-2019-0108401 filed on Sep. 2, 2019, which are hereby incorporated by reference in their entirety for all purposes as if fully set forth herein.

BACKGROUND

Field of the Disclosure

The present disclosure relates to a transparent display device. More particularly, the present disclosure relates to a transparent display device in which input images can be displayed in a transmission area as well as in an emission area while the display device is driven.

Description of the Background

Various display devices that are less bulky and lighter than cathode ray tubes are being developed. Examples of the display devices include a liquid crystal display (LCD), a field emission display (FED), a plasma display panel (PDP), an organic light emitting display device (OLED), etc.

Among these flat panel display devices, an OLED is a self-emission display device configured to emit light by exciting organic compounds. In contrast to an LCD, the OLED does not require a backlight. Thus, the OLED has advantages of a thin profile, lightness in weight, and a simpler manufacturing process. Also, the OLED has been widely used because it can be manufactured at low temperatures, has a fast response time of 1 ms or less, and features low power consumption, wide viewing angle, and high contrast.

The OLED includes an organic light emitting diode that converts electric energy into light energy. The organic light emitting diode includes an anode, a cathode, and an organic emission layer disposed between the anode and the cathode. Holes and electrons are injected from the anode and cathode, respectively, and recombined in the emission layer to form excitons, whereby the OLED displays an image when the excitons fall from the excited state to the ground state.

Recently, studies on transparent display devices have been actively carried out. A transparent display device refers to a display device that enables a user in front of a display panel to recognize visual information displayed on the display panel and objects located on the rear surface of the display panel. To this end, the transparent display device includes an emission area where driving elements are disposed to display input images, and a transmission area which transmits external light.

In the transparent display device, the transmission area needs to have a sufficient size for the user to more clearly recognize the background information located on the rear surface of the display panel. Also, the emission area needs to have a sufficient size to secure a desired aperture ratio. Therefore, in order for the transparent display device to effectively perform its function, the emission area and the transmission area need to be appropriately assigned within a limited space. However, a simple layout design of the emission area and the transmission area cannot satisfy the requirements of the transparent display device.

SUMMARY

The present disclosure provides a transparent display device in which a transmission area and an emission area of sufficient sizes can be secured.

According to an aspect of the present disclosure, a transparent display device includes: a substrate in which a sub-pixel having an organic light emitting diode and an auxiliary sub-pixel adjacent to the sub-pixel and having an auxiliary organic light emitting diode are placed. The organic light emitting diode includes a 1-1 electrode in which a transparent conductive layer and reflective layer are laminated. The auxiliary organic light emitting diode includes a 1-2 electrode in which the transparent conductive layer is extended and provided.

In an aspect of the present disclosure, the organic light emitting diode and the auxiliary organic light emitting diode may share an organic emission layer located on the 1-1 electrode and the 1-2 electrode and a second electrode located on the organic emission layer.

In an aspect of the present disclosure, the sub-pixel includes a circuit unit including at least one transistor, and the circuit unit may be electrically connected to the organic light emitting diode and the auxiliary organic light emitting diode.

In an aspect of the present disclosure, the substrate is defined into a first area where the sub-pixel is placed and a second area where the auxiliary sub-pixel is placed. The second area emits light while the transparent display device is driven and transmits external light while the transparent display device is not driven.

In an aspect of the present disclosure, the transparent conductive layer may include a first transparent conductive layer located in the first area and a second transparent conductive layer located as extended from the first area to the second area. The 1-1 electrode may include the first transparent conductive layer, the reflective layer and the second transparent conductive layer, and the 1-2 electrode may include the second transparent conductive layer.

In an aspect of the present disclosure, the first transparent conductive layer may be located on the reflective layer in the first area, and the second transparent conductive layer may be located under the reflective layer in the first area.

In an aspect of the present disclosure, the transparent display device further includes an intermediate insulating layer which is interposed between the reflective layer and the second transparent conductive layer and through which the second transparent conductive layer is exposed in the second area. The reflective layer and the second transparent conductive layer may be connected to each other in the first area through an open hole penetrating the intermediate insulating layer.

In an aspect of the present disclosure, the intermediate insulating layer may be located only in the first area.

In an aspect of the present disclosure, the transparent display device further includes a passivation layer and an overcoat layer laminated between the circuit unit and the second transparent conductive layer, and the overcoat layer may be removed from the second area.

In an aspect of the present disclosure, the second transparent conductive layer may be in contact with the overcoat layer in the first area and with the passivation layer in the second area.

In an aspect of the present disclosure, the first transparent conductive layer may be located under the reflective layer in the first area, and the second transparent conductive layer may be located on the reflective layer in the first area.

In an aspect of the present disclosure, the transparent display device further includes a passivation layer and an overcoat layer laminated between the circuit unit and the second transparent conductive layer, and the overcoat layer may be removed from the second area.

In an aspect of the present disclosure, the second transparent conductive layer may be in contact with the reflective layer in the first area and with the passivation layer in the second area.

In an aspect of the present disclosure, the transparent display device may further include a bank layer between the sub-pixel and the auxiliary sub-pixel.

According to another aspect of the present disclosure, a transparent display device having a sub-pixel and an auxiliary sub-pixel adjacent to each other, includes: an organic light emitting diode disposed in the sub-pixel and including a first-main electrode that has a transparent conductive layer and a reflective layer; and an auxiliary organic light emitting diode disposed in the auxiliary sub-pixel, and including a portion of the transparent conductive layer extended from the first main electrode that constitutes a first-auxiliary electrode, an organic emission layer located on the first-main electrode and the first-auxiliary electrode and shared by the organic light emitting diode and the auxiliary organic light emitting diode; and a second electrode disposed on the organic emission layer.

According to an aspect of the present disclosure, a display device includes a light transmission area and thus can function as a transparent display device. The transmission area also supplies light for displaying input images, and, thus, a sufficient aperture ratio can be secured. Therefore, it is possible to provide a high-quality transparent display device.

According to an aspect of the present disclosure, the display device satisfies a required aperture ratio. Also, the display device controls the sizes of an emission area and a transmission area depending on the desired luminance, efficiency of an organic light emitting diode and transmittance. Therefore, it is possible to provide a transparent display device with a remarkably improved degree of design freedom.

BRIEF DESCRIPTION OF THE DRAWINGS

The above and other aspects, features and advantages of the present disclosure will be more clearly understood from the following detailed description taken in conjunction with the accompanying drawings, in which.

DETAILED DESCRIPTION

Figure 1:
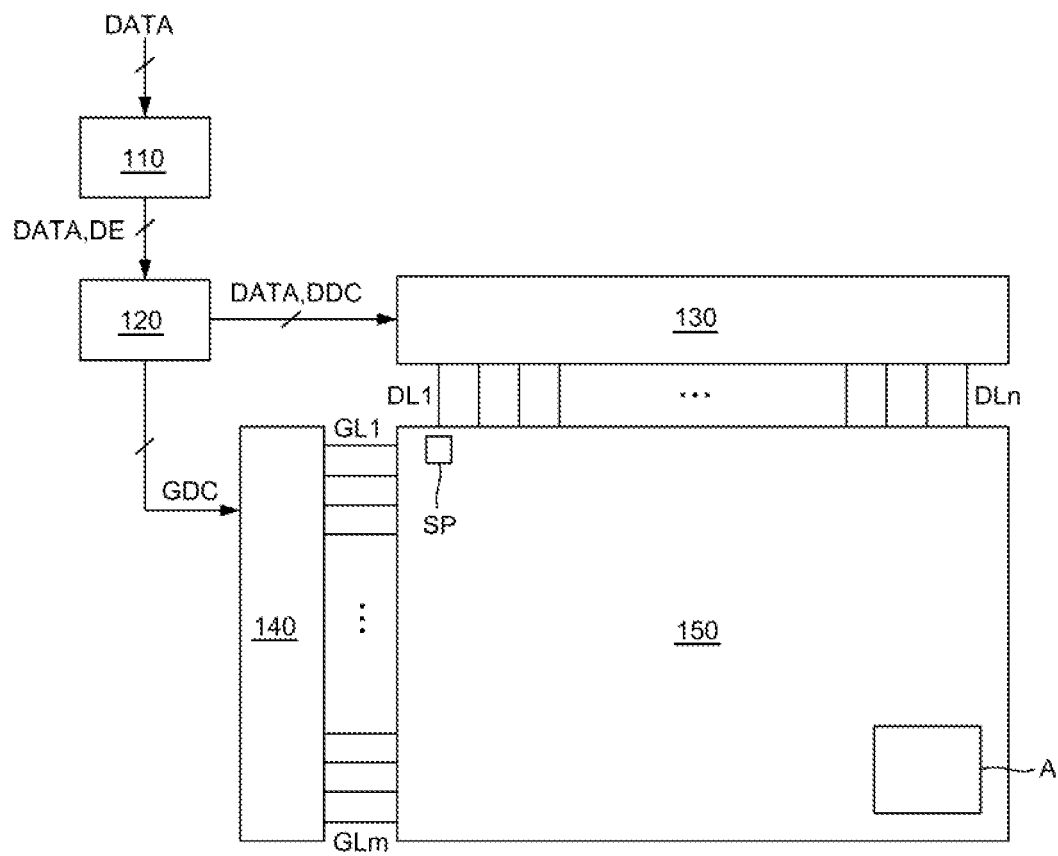
FIG. 1 is a schematic block diagram of an organic light emitting display device.

Hereinafter, aspects of the present disclosure will be described with reference to the accompanying drawings. Throughout the whole specification, the same reference numerals denote substantially the same elements. Further, in the following description, a detailed explanation of known technologies or configurations related to the present disclosure may be omitted to avoid unnecessarily obscuring the subject matter of the present disclosure. In the following aspects, the same components are described in a first example and description of such components may be omitted in the other aspects.

The terms "first," "second," etc. may be used to describe various components, but the components are not limited by such terms. The terms are used only for the purpose of distinguishing one component from other components.

A display device according to the present disclosure includes display elements on a substrate. In an example, the substrate may be transparent. The display device can be implemented as a field emission display, a liquid crystal display, an electrophoretic display device, or the like. However, hereinafter, the display device will be described as an organic light emitting display device among the field emission displays for convenience in understanding.

Figure 2:
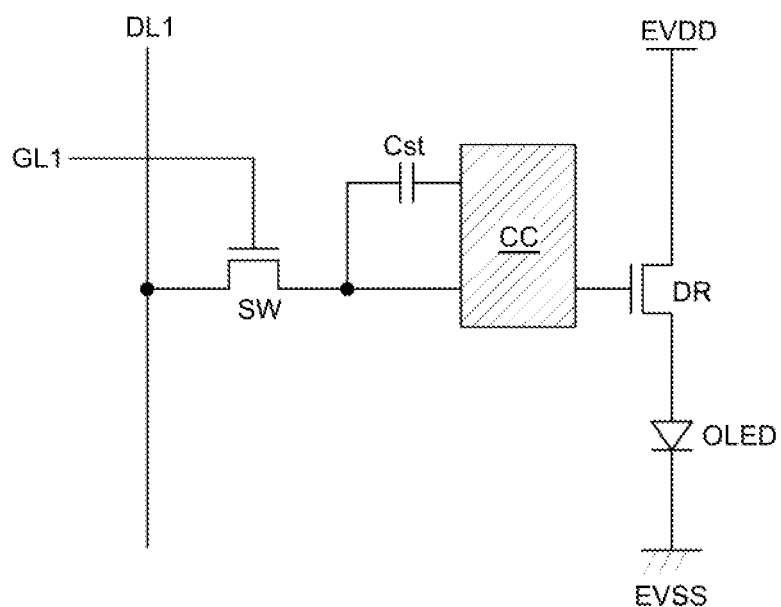
FIG. 2 schematically illustrates a circuit configuration of a sub-pixel.
Figure 3:
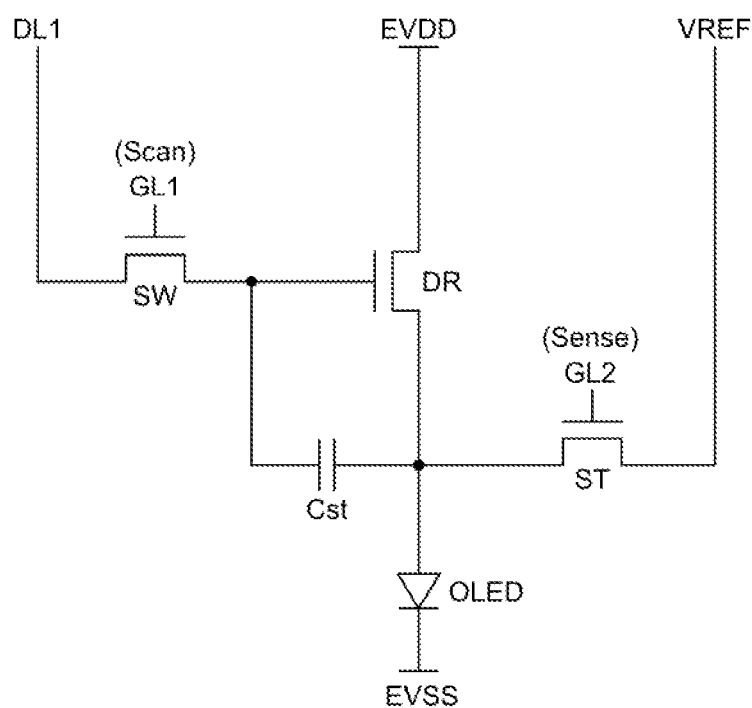
FIG. 3 illustrates an example of a detailed circuit configuration of the sub-pixel.

FIG. 1 is a schematic block diagram of an organic light emitting display device. FIG. 2 schematically illustrates a circuit configuration of a sub-pixel. FIG. 3 illustrates an example of a detailed circuit configuration of the sub-pixel.

As shown in FIG. 1, an organic light emitting display device includes an image processer 110, a timing controller 120, a data driver 130, a scan driver 140 and a display panel 150.

The image processer 110 outputs a data enable signal DE together with a data signal DATA supplied from the outside. The image processer 110 may output at least one of a vertical synchronizing signal, a horizontal synchronizing signal and a clock signal in addition to the data enable signal DE, but the illustration of these signals will be omitted for convenience of explanation.

The timing controller 120 receives the data signal DATA together with driving signals including the data enable signal DE or at least one of the vertical synchronizing signal, the horizontal synchronizing signal and the clock signal from the image processer 110. The timing controller 120 outputs a gate timing control signal GDC for controlling an operation timing of the scan driver 140 and a data timing control signal DDC for controlling an operation timing of the data driver 130, based on the driving signals.

In response to the data timing control signal DDC supplied from the timing controller 120, the data driver 130 samples and latches the data signal DATA supplied from the timing controller 120. Then, the data driver 130 converts the data signal DATA into a gamma reference voltage and outputs it. The data driver 130 outputs the data signal DATA through data lines DL1 to DLn. The data driver 130 may be configured in the form of an integrated circuit (IC).

In response to the gate timing control signal GDC supplied from the timing controller 120, the scan driver 140 outputs a scan signal. The scan driver 140 outputs a scan signal through gate lines GL1 to GLm. The scan driver 140 may be configured in the form of an integrated circuit (IC) or may be provided on the display panel 150 in a gate in panel (GIP) scheme.

The display panel 150 displays images in response to the data signal DATA and the scan signal supplied from the data driver 130 and the scan driver 140, respectively. The display panel 150 includes sub-pixels SP that are operated to display images.

As shown in FIG. 2, each sub-pixel SP includes a switching transistor SW, a driving transistor DR, a capacitor Cst, a compensation circuit CC and an organic light emitting diode OLED.

In response to a scan signal supplied through a first gate line GL1, the switching transistor SW performs a switching operation to allow a data signal supplied through a data line DL to be stored as a data voltage in the capacitor Cst. The driving transistor DR operates to allow a driving current to flow between a power line EVDD (high-potential voltage) and a cathode power line EVSS (low-potential voltage) depending on the data voltage stored in the capacitor Cst. The organic light emitting diode OLED operates to emit light depending on a driving current formed by the driving transistor DR.

The compensation circuit CC is a circuit that is added inside a sub-pixel so as to compensate for a threshold voltage of the driving transistor DR. The compensation circuit CC includes at least one transistor. The compensation circuit CC has various configurations depending on an external compensation method. An example thereof will be described below.

As illustrated in FIG. 3, the compensation circuit CC includes a sensing transistor ST and a sensing line VREF (or a reference line). The sensing transistor ST is connected between a source electrode of the driving transistor DR and an anode electrode of the organic light emitting diode OLED (hereinafter, referred to as a sensing node). The sensing transistor ST operates to supply an initialization voltage (or sensing voltage) received through the sensing line VREF to the sensing node of the driving transistor DR. Otherwise, the sensing transistor ST operates to sense a voltage or current of the sensing node of the driving transistor DR or a voltage or current of the sensing line VREF.

The switching transistor SW includes a drain electrode connected to a first data line DL1 and a source electrode connected to a gate electrode of the driving transistor DR. The driving transistor DR includes a drain electrode connected to a power line EVDD and a source electrode connected to the anode electrode of the organic light emitting diode OLED. The capacitor Cst includes a first capacitor electrode connected to the gate electrode of the driving transistor DR and a second capacitor electrode connected to the anode electrode of the organic light emitting diode OLED. The organic light emitting diode OLED includes the anode electrode connected to the source electrode of the driving transistor DR and a cathode electrode connected to a second power line EVSS. The sensing transistor ST includes a drain electrode connected to the sensing line VREF and a source electrode connected to the anode electrode of the organic light emitting diode OLED and the source electrode of the driving transistor DR which is a sensing node. In the above description, the transistors are implemented as n-type transistors, but may not be limited thereto.

An operation time of the sensing transistor ST may be similar/identical to or different from an operation time of the switching transistor SW depending on an external compensation algorithm (or configuration of the compensation circuit). For example, the gate electrode of the switching transistor SW may be connected to a first gate line GL1 and the gate electrode of the sensing transistor ST may be connected to a second gate line GL2. In this case, a scan signal Scan is transmitted to the first gate line GL1 and a sensing signal Sense is transmitted to the second gate line GL2. In another example, the first gate line GL1 connected to the gate electrode of the switching transistor SW and the second gate line GL2 connected to the gate electrode of the sensing transistor ST may be connected to be commonly shared.

The sensing line VREF may be connected to the data driver. In this case, the data driver may sense a sensing node of each sub-pixel and generate a sensing result in real time, in a non-display time of an image, or in a time period of N-th frame (N is an integer equal to or greater than 1). Meanwhile, the switching transistor SW and the sensing transistor ST may be turned on at the same time. In this case, a sensing operation through the sensing line VREF and a data output operation of outputting a data signal may be separated (differentiated) on a basis of a time-division scheme of the data driver.

Further, a compensation target according to the sensing result may be a digital data signal, an analog data signal, or a gamma voltage. Furthermore, the compensation circuit which generates a compensation signal (or a compensation voltage) based on the sensing result may be provided inside the data driver or inside the timing controller. Otherwise, the compensation circuit may be implemented as a separate circuit.

FIG. 3 illustrates an example of a sub-pixel having a 3T(Transistor)1C(Capacitor) structure including the switching transistor SW, the driving transistor DR, the capacitor Cst, the organic light emitting diode OLED, and the sensing transistor ST. However, if the compensation circuit CC is added, a sub-pixel may be configured having a 3T2C, 4T2C, 5T2C, or 6T2C structure. Hereinafter, an example of a sub-pixel having a 3T1C structure will be described for convenience of explanation.

Figure 4:
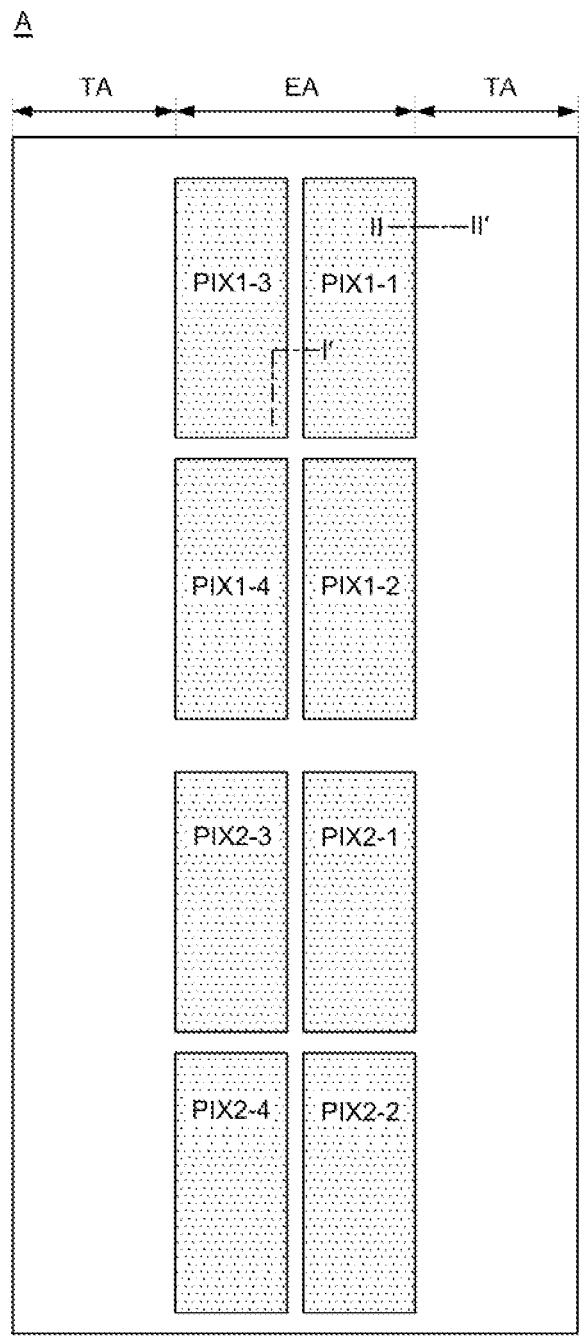
FIG. 4 is a plan view schematically illustrating an A area of FIG. 1 according to a first aspect of the present disclosure.
Figure 5:
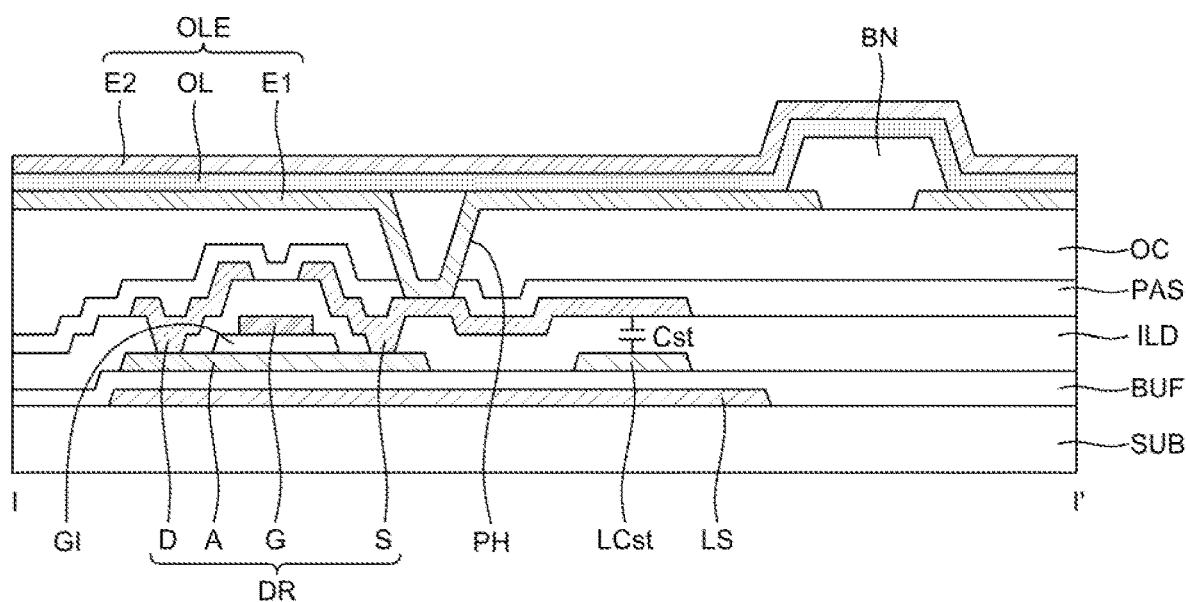
FIG. 5 is a cross-sectional view as taken along line I-I' of FIG. 4.
Figure 6:
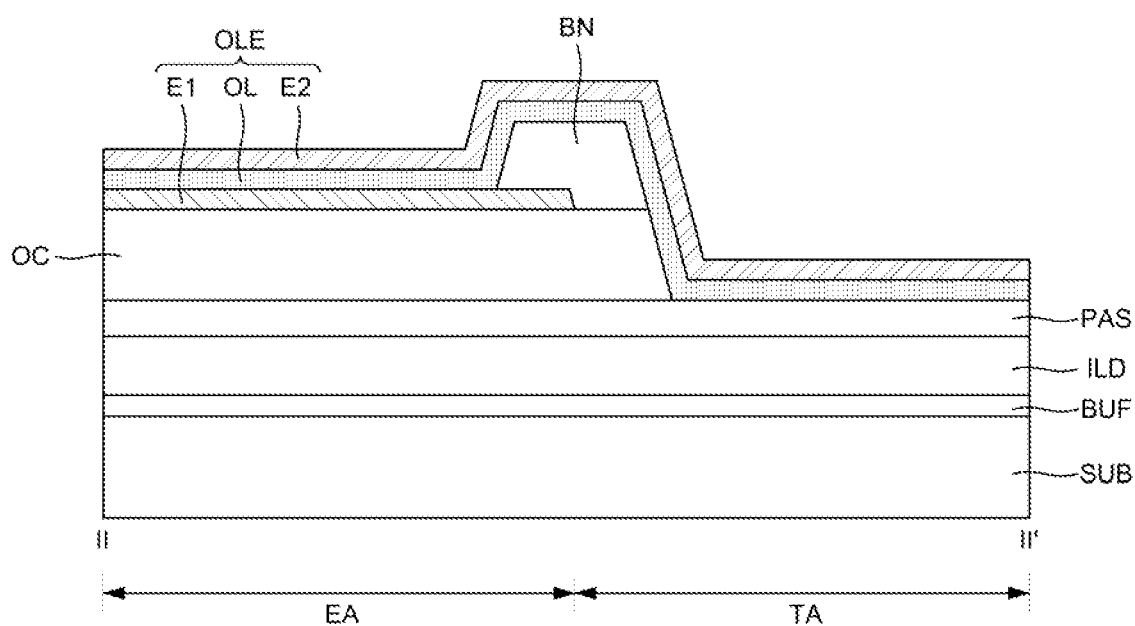
FIG. 6 is a cross-sectional view as taken along line II-II' of FIG. 4.
Figure 7:
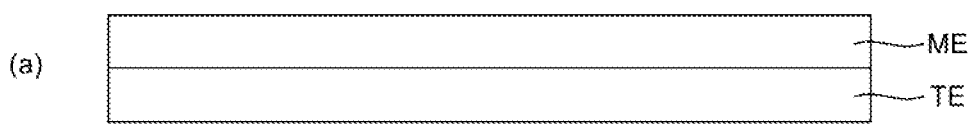
FIG. 7 illustrates various configurations for a first electrode.
Figure 7:
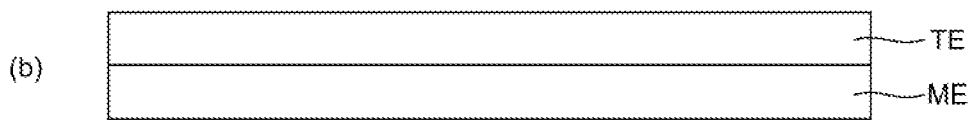
Figure 7:
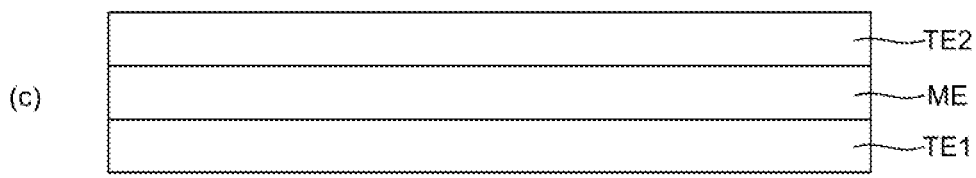

FIG. 4 is a plan view schematically illustrating an A area of FIG. 1 according to a first aspect of the present disclosure. FIG. 5 is a cross-sectional view as taken along line I-I' of FIG. 4. FIG. 6 is a cross-sectional view as taken along line II-II' of FIG. 4. FIG. 7 illustrates various configurations of a first electrode.

Referring to FIG. 4, a display device according to the first aspect of the present disclosure includes pixels. The pixels may be disposed in a matrix form on a substrate of a display panel, but may not be limited thereto. The pixels include a first area EA and a second area TA.

The first area EA may be defined as an area where light for displaying input images is emitted. The first area EA may be defined as an emission area. The first area EA may include sub-pixels PIX each having an organic light emitting diode. Each sub-pixel PIX may include a circuit unit electrically connected to the organic light emitting diode. The circuit unit may include at least one transistor and at least one capacitor.

The second area TA may be defined as an area which transmits external light so that a user can recognize objects located on the rear surface of the display device. Otherwise, the second area TA may be defined as an area where signal lines are not disposed outside the first area EA. If signal lines are formed of a transparent material and have a predetermined transparency, an area where the signal lines are disposed may also be assigned as the second area TA. The second area TA may be referred to as a transmission area.

The pixels include sub-pixels PIX. The display device according to an exemplary aspect of the present disclosure can be implemented as a top emission type. Thus, most of the areas where the sub-pixels PIX are disposed may be assigned as the first area EA. The sub-pixels PIX may be disposed in a first direction (for example, Y-axis direction) and a second direction (for example, X-axis direction) crossing each other. Each pixel may include red (R), green (G), blue (B) and white (W) sub-pixels PIX, but may not be limited thereto. Hereinafter, an example of a pixel including red (R), green (G), blue (B) and white (W) sub-pixels PIX will be described for convenience of explanation.

For example, the first area EA may include a first pixel and a second pixel adjacent to each other in the first direction. The first pixel includes a 1-1 sub-pixel PIX1-1, a 1-2 sub-pixel PIX1-2, a 1-3 sub-pixel PIX1-3 and a 1-4 sub-pixel PIX1-4. The second pixel includes a 2-1 sub-pixel PIX2-1, a 2-2 sub-pixel PIX2-2, a 2-3 sub-pixel PIX2-3 and a 2-4 sub-pixel PIX2-4. The 1-1 sub-pixel PIX1-1 and the 2-1 sub-pixel PIX2-1 emit light of the same first color. The 1-2 sub-pixel PIX1-2 and the 2-2 sub-pixel PIX2-2 emit light of the same second color. The 1-3 sub-pixel PIX1-3 and the 2-3 sub-pixel PIX2-3 emit light of the same third color. The 1-4 sub-pixel PIX1-4 and the 2-4 sub-pixel PIX2-4 emit light of the same fourth color. Each of the first, second, third and fourth colors may be assigned as any one of red (R), green (G), blue (B) and white (W) colors.

The sub-pixels PIX disposed inside a pixel may be disposed in a quad type as shown in the drawing. The 1-1 sub-pixel PIX1-1 and the 2-1 sub-pixel PIX2-1 may be disposed adjacent to the 1-2 sub-pixel PIX1-2 and the 2-2 sub-pixel PIX2-2, respectively, in the first direction. The 1-3 sub-pixel PIX1-3 and the 2-3 sub-pixel PIX2-3 may be disposed adjacent to the 1-4 sub-pixel PIX1-4 and the 2-4 sub-pixel PIX2-4, respectively, in the first direction. The 1-1 sub-pixel PIX1-1 and the 2-1 sub-pixel PIX2-1 may be disposed adjacent to the 1-3 sub-pixel PIX1-3 and the 2-3 sub-pixel PIX2-3, respectively, in the second direction. The 1-2 sub-pixel PIX1-2 and the 2-2 sub-pixel PIX2-2 may be disposed adjacent to the 1-4 sub-pixel PIX1-4 and the 2-4 sub-pixel PIX2-4, respectively, in the second direction.

The sub-pixels PIX that emit light of the same color are disposed in the first direction. That is, the 1-1 sub-pixel PIX1-1 and the 2-1 sub-pixel PIX2-1 may be disposed in the first direction and the 1-2 sub-pixel PIX1-2 and the 2-2 sub-pixel PIX2-2 may be disposed in the first direction. Also, the 1-3 sub-pixel PIX1-3 and the 2-3 sub-pixel PIX2-3 may be disposed in the first direction and the 1-4 sub-pixel PIX1-4 and the 2-4 sub-pixel PIX2-4 may be disposed in the first direction.

In this case, the two sub-pixels PIX that emit light of different colors from each other are alternately disposed in sequence in the first direction. That is, the 1-1 sub-pixel PIX1-1 emitting light of the first color, the 1-2 sub-pixel PIX1-2 emitting light of the second color, the 2-1 sub-pixel PIX2-1 emitting light of the first color and the 2-2 sub-pixel PIX2-2 emitting light of the second color are disposed in sequence in the first direction. Also, the 1-3 sub-pixel PIX1-3 emitting light of the third color, the 1-4 sub-pixel PIX1-4 emitting light of the fourth color, the 2-3 sub-pixel PIX2-3 emitting light of the third color and the 2-4 sub-pixel PIX2-4 emitting light of the fourth color are disposed in sequence in the first direction.

Each of the sub-pixels PIX includes a transistor placed on the substrate and an organic light emitting diode electrically connected to the transistor.

For example, referring to FIG. 5 and FIG. 6, a light-shielding layer LS is located on a substrate SUB. The light-shielding layer LS blocks light incident from the outside and suppresses the generation of photoelectric current in a transistor. A buffer layer BUF is located on the light-shielding layer LS. The buffer layer BUF protects a thin film transistor, which is to be formed in a subsequent process, from impurities, such as alkali ions, flowing out from the light-shielding layer LS. The buffer layer BUF may be silicon nitride (SiNx) or a multilayer thereof.

A semiconductor layer A of the driving transistor DR is located on the buffer layer BUF and a capacitor lower electrode LCst is located apart from the semiconductor layer A. The semiconductor layer A and the capacitor lower electrode LCst may be formed of a silicon semiconductor or an oxide semiconductor. The silicon semiconductor may include amorphous silicon or crystallized polycrystalline silicon. The semiconductor layer A includes a drain region and a source region each containing p-type or n-type impurities and also includes a channel between the drain region and the source region. The capacitor lower electrode LCst may be doped with impurities and become conductive.

A gate insulating layer GI is located on the semiconductor layer A. The gate insulating layer GI may be silicon oxide (SiOx), silicon nitride (SiNx) or a multilayer thereof. At a certain region of the semiconductor layer A on the gate insulating layer GI, i.e., at a position corresponding to the channel when impurities are injected, a gate electrode G is located. The gate electrode G is formed of any one selected from the group consisting of molybdenum (Mo), aluminum (Al), chromium (Cr), gold (Au), titanium (Ti), nickel (Ni), neodymium (Nd) and copper (Cu), or an alloy thereof. Further, the gate electrode G may be a multilayer formed of any one selected from the group consisting of molybdenum (Mo), aluminum (Al), chromium (Cr), gold (Au), titanium (Ti), nickel (Ni), neodymium (Nd) and copper (Cu), or an alloy thereof. For example, the gate electrode G may be a dual layer of molybdenum/aluminum-neodymium or molybdenum/aluminum.

An interlayer insulating layer ILD that insulates the gate electrode G is located on the gate electrode G. The interlayer insulating layer ILD may be a silicon oxide (SiOx) layer, a silicon nitride (SiNx) layer or a multilayer thereof. A source electrode S and a drain electrode D are located on the interlayer insulating layer ILD. The source electrode S and the drain electrode D are connected to the semiconductor layer A through a contact hole through which the source region of the semiconductor layer A is exposed. Each of the source electrode S and the drain electrode D may be formed as a single layer or a multilayer. If each of the source electrode S and the drain electrode D is formed as a single layer, it may be formed of any one selected from the group consisting of molybdenum (Mo), aluminum (Al), chromium (Cr), gold (Au), titanium (Ti), nickel (Ni), neodymium (Nd)

and copper (Cu), or an alloy thereof. If each of the source electrode S and the drain electrode D is formed as a multilayer, it may be formed as a dual layer of molybdenum/aluminum-neodymium or a triple layer of titanium/aluminum/titanium, molybdenum/aluminum/molybdenum or molybdenum/aluminum-neodymium/molybdenum. Therefore, the driving transistor DR is configured including the semiconductor layer A, the gate electrode G, the source electrode S and the drain electrode D. Also, the capacitor Cst is configured including the capacitor lower electrode LCst and the drain electrode D serving as a capacitor upper electrode.

A passivation layer PAS is located on the substrate SUB including the driving transistor DR and the capacitor Cst. The passivation layer PAS is an insulating layer protecting the elements under the passivation layer PAS and may be a silicon oxide (SiOx) layer, a silicon nitride (SiNx) layer, or a multilayer thereof. An overcoat layer OC is located on the passivation layer PAS. The overcoat layer OC may be a planarization layer for reducing a step of an underlying structure and may be formed of an organic material such as polyimide, benzocyclobutene series resin and acrylate. The overcoat layer OC may be formed through a spin-on glass (SOG) method for coating the organic material in a liquid state and then curing the organic material. In a part of the overcoat layer OC, a pixel contact hole PH penetrating the overcoat layer OC and the passivation layer PAS to expose the source electrode S is located.

The organic light emitting diode includes a first electrode E1, an organic emission layer OL and a second electrode E2 that face each other. The first electrode E1 may be an anode and the second electrode E2 may be a cathode, but may not be limited thereto.

The first electrode E1 may be connected to the source electrode S of the driving transistor DR through the pixel contact hole PH penetrating the overcoat layer OC and the passivation layer PAS. The first electrode E1 may include a reflective layer and function as a reflective electrode. The reflective layer may be formed of aluminum (Al), copper (Cu), silver (Ag), nickel (Ni), molybdenum (Mo), titanium (Ti) or an alloy thereof, or may be formed of APC (silver/palladium/copper alloy). However, the present disclosure may not be limited thereto. The reflective layer may reflect light from the organic emission layer OL in an upward direction. The first electrode E1 may be formed corresponding to each sub-pixel PIX in the first area EA.

For example, as shown in (a) of FIG. 7, the first electrode E1 may have a structure in which a transparent conductive layer TE and a reflective layer ME are laminated in sequence. For another example, as shown in (b) of FIG. 7, the first electrode E1 may have a structure in which a reflective layer ME and a transparent conductive layer TE are laminated in sequence. For yet another example, as shown in (c) of FIG. 7, the first electrode E1 may have a structure in which a first transparent conductive layer TE1, a reflective layer ME and a second transparent conductive layer TE2 are laminated in sequence. In this case, each of the first transparent conductive layer and the second transparent conductive layer may be indium tin oxide (ITO) and the reflective layer may be molytitanium (MoTi) but may not be limited thereto.

A bank layer BN is disposed on the substrate SUB on which the first electrode E1 has been formed. The bank layer BN may be formed of an organic material such as polyimide, benzocyclobutene series resin and acrylate. The bank layer BN includes an opening through which most of the first electrode E1 is exposed. The bank layer BN may be disposed to expose a central portion of the first electrode E1 and cover at least a part of a side end of the first electrode E1.

To secure a predetermined transmittance of the second area TA, at least some of the insulating layers formed in the second area TA may be removed. For example, as shown in FIG. 6, the overcoat layer OC and the bank layer BN may be patterned and removed from at least a part of the second area TA. Although not illustrated in the drawing, at least one of the buffer layer BUF, the interlayer insulating layer ILD and the passivation layer PAS may be patterned and removed from at least a part of the second area TA. However, it is to be noted that the insulating layers can be removed under conditions in which a short of electrodes and/or signal lines that are disposed in the second area TA can be suppressed.

The organic emission layer OL is disposed on the substrate SUB on which the bank layer BN has been formed. The organic emission layer OL is a layer in which electrons and holes are combined to emit light and includes an emission layer EML. The organic emission layer OL may further include any one or more of a hole injection layer HIL, a hole transport layer HTL, an electron transport layer ETL and an electron injection layer EIL.

The emission layer EML may be configured to emit white light. In this case, each sub-pixel PIX may be combined with a corresponding color filter to implement red (R), green (G), blue (B) or white (W) color. The emission layer EML may be formed in the first area EA where sub-pixels PIX are disposed and extended and formed in the second area TA.

For example, the emission layer EML emitting white light may be extended so as to be formed as one body on the sub-pixels PIX. Red (R), green (G) and blue (B) color filters may be assigned to red (R), green (G) and blue (B) sub-pixels PIX, respectively. Although not illustrated in the drawing, a color filter may be formed on a facing substrate that faces the substrate SUB in a direction in which light generated from the emission layer EML is emitted. For another example, a color filter may be disposed on the second electrode E2 on the substrate SUB.

The second electrode E2 is disposed on the organic emission layer OL. The second electrode E2 may be widely formed on the entire surface of the substrate SUB. The second electrode E2 may function as a transmission electrode. The second electrode E2 may be formed of a transparent conductive material such as indium tin oxide (ITO) and indium zinc oxide (IZO). Alternatively, the second electrode E2 may be formed of a material, which is thin enough to transmit light, for example, magnesium (Mg), calcium (Ca), aluminum (Al), silver (Ag), or an alloy thereof.

The display device according to the first aspect of the present disclosure is equipped with a display panel including the first area EA as an emission area and the second area TA as a transmission area. Therefore, while the display device is driven, a user in front of the display panel can be supplied with visual information displayed on the first area EA of the display panel. Also, while the display device is not driven, the user can be supplied through the second area TA with background information of objects located on the rear surface of the display panel. Therefore, the display device according to the first aspect of the present disclosure can be implemented as a transparent display device.

In the transparent display device, the second area TA needs to have a sufficient size for the user to more clearly recognize the background information located on the rear surface of the display panel. Also, the first area EA needs to have a sufficient size to secure a desired aperture ratio.

However, the size of the first area EA and the size of the second area TA have a trade-off relationship within a limited space. Therefore, a simple layout design is not sufficient to provide a high-quality transparent display device.

For example, in the first aspect of the present disclosure, while the display device is driven, light for displaying input images is supplied only from the first area EA. That is, an area assigned as the second area TA is a non-emission area, and, thus, the aperture ratio is reduced by that much, which is a problem.

Figure 8:
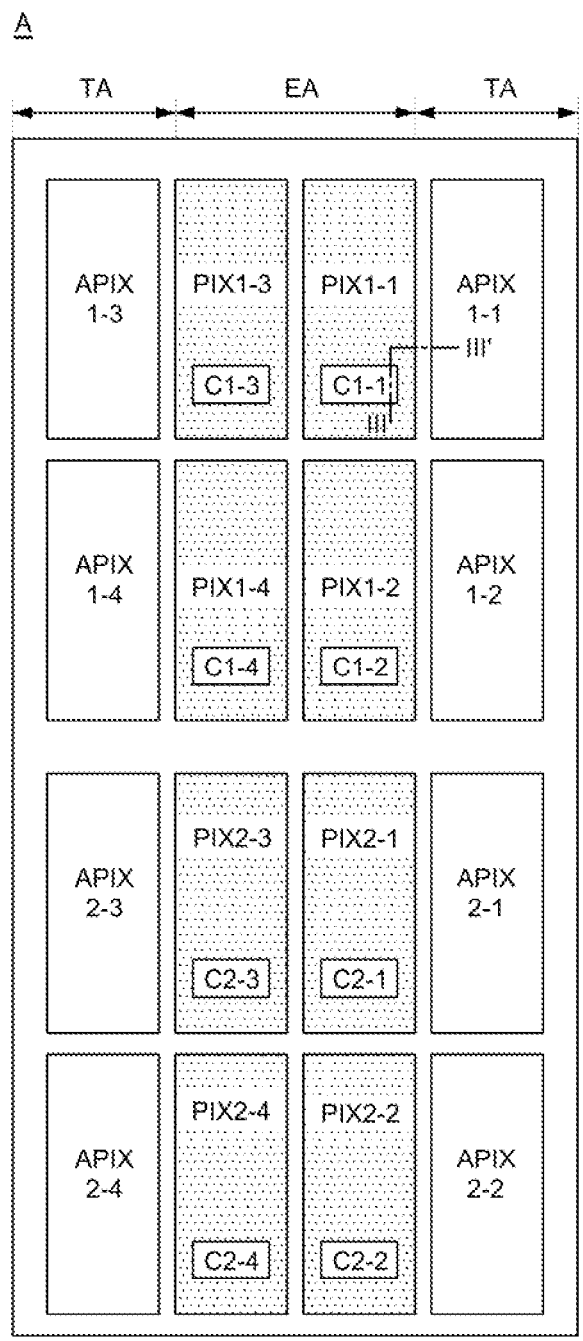
FIG. 8 is a plan view schematically illustrating area A of FIG. 1 according to a second aspect of the present disclosure.
Figure 9:
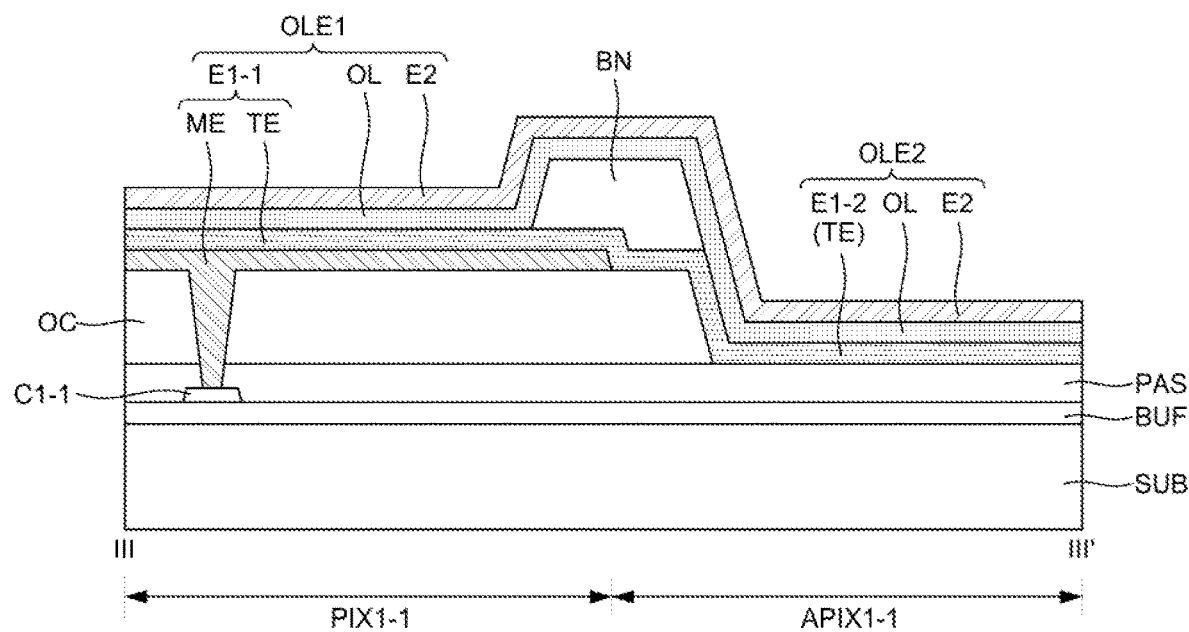
FIG. 9 and FIG. 10 are cross-sectional views as taken along line of FIG. 8.
Figure 10:
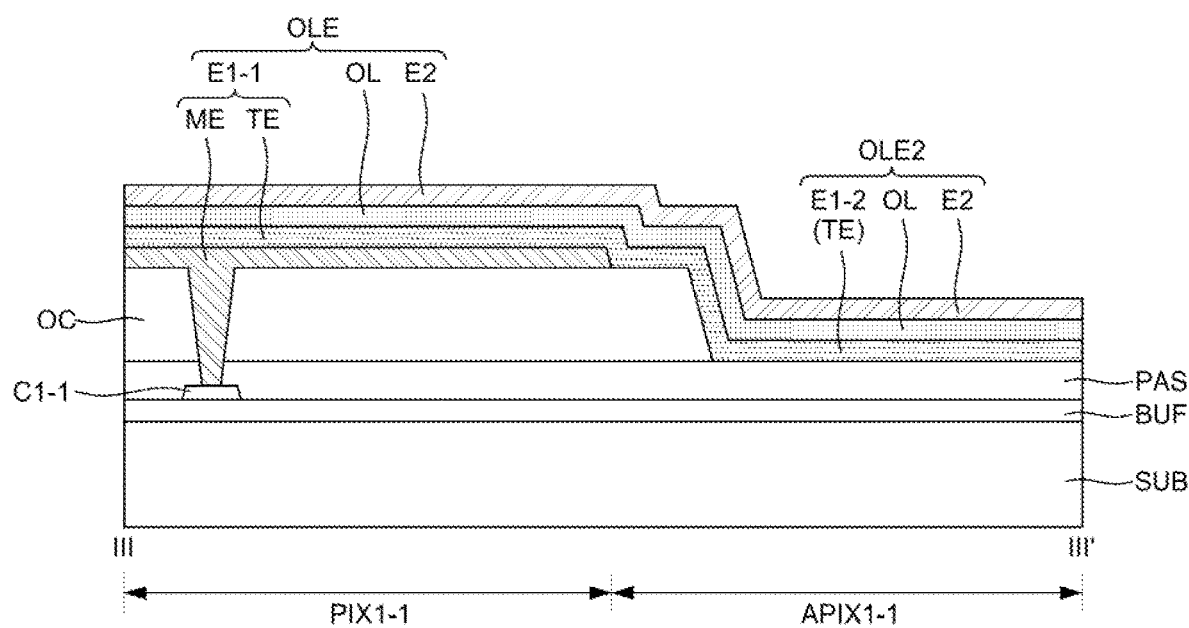

FIG. 8 is a plan view schematically illustrating the A area of FIG. 1 according to a second aspect of the present disclosure. FIG. 9 and FIG. 10 are cross-sectional views as taken along line III-III' of FIG. 8. In the second aspect of the present disclosure, detailed descriptions of parts identical or corresponding to those of the above-described first aspect will be omitted.

Referring to FIG. 8, a display device according to the second aspect of the present disclosure includes pixels. The pixels may be disposed in a matrix form on a substrate of a display panel but may not be limited thereto. The pixels include the first area EA and the second area TA. In the drawing, the first area EA and the second area TA are illustrated as disposed adjacent to each other in the first direction but may not be limited thereto. The first area EA and the second area TA may be disposed adjacent to each other in the second direction. Hereinafter, an example where the first area EA and the second area TA are disposed adjacent to each other in the first direction will be described for convenience of explanation.

The first area EA may be defined as an area where light for displaying input images is emitted. The first area EA may be defined as an emission area. The first area EA may include sub-pixels PIX each having an organic light emitting diode. Each sub-pixel PIX may include a circuit unit C electrically connected to the organic light emitting diode. The circuit unit C may include at least one transistor and at least one capacitor.

The second area TA may be defined as an area which transmits external light so that a user can recognize objects located on the rear surface of the display device. Otherwise, the second area TA may be defined as an area where signal lines are not disposed outside the first area EA. If signal lines are formed of a transparent material and have a predetermined transparency, an area where the signal lines are disposed may also be assigned as the second area TA. The second area TA may be referred to as a transmission area.

In the second aspect of the present disclosure, while the display device is driven, the second area TA displays input images. Therefore, the second area TA may be referred to as an auxiliary emission area.

The second area TA includes auxiliary sub-pixels APIX each having an organic light emitting diode. Each of the auxiliary sub-pixels APIX includes an organic light emitting diode. An auxiliary sub-pixel APIX in the second area TA may be turned ON/OFF simultaneously with a corresponding sub-pixel PIX in the first area EA. That is, the auxiliary sub-pixel APIX in the second area TA may be driven by a circuit unit that drives the corresponding sub-pixel PIX in the first area EA. In other words, the auxiliary sub-pixel APIX in the second area TA and the corresponding sub-pixel PIX in the first area EA may share a single circuit unit.

For example, the first area EA may include a first pixel and a second pixel adjacent to each other in the first direction. The first pixel includes the 1-1 sub-pixel PIX1-1, the 1-2 sub-pixel PIX1-2, the 1-3 sub-pixel PIX1-3 and the 1-4 sub-pixel PIX1-4. The second pixel includes the 2-1 sub-pixel PIX2-1, the 2-2 sub-pixel PIX2-2, the 2-3 sub-pixel PIX2-3 and the 2-4 sub-pixel PIX2-4. The 1-1 sub-pixel PIX1-1 and the 2-1 sub-pixel PIX2-1 emit light of the same first color. The 1-2 sub-pixel PIX1-2 and the 2-2 sub-pixel PIX2-2 emit light of the same second color. The 1-3 sub-pixel PIX1-3 and the 2-3 sub-pixel PIX2-3 emit light of the same third color. The 1-4 sub-pixel PIX1-4 and the 2-4 sub-pixel PIX2-4 emit light of the same fourth color. Each of the first, second, third and fourth colors may be assigned as any one of red (R), green (G), blue (B) and white (W) colors.

The sub-pixels PIX disposed inside a pixel may be disposed in a quad type as shown in the drawing. The 1-1 sub-pixel PIX1-1 and the 2-1 sub-pixel PIX2-1 may be disposed adjacent to the 1-2 sub-pixel PIX1-2 and the 2-2 sub-pixel PIX2-2, respectively, in the first direction. The 1-3 sub-pixel PIX1-3 and the 2-3 sub-pixel PIX2-3 may be disposed adjacent to the 1-4 sub-pixel PIX1-4 and the 2-4 sub-pixel PIX2-4, respectively, in the first direction. The 1-1 sub-pixel PIX1-1 and the 2-1 sub-pixel PIX2-1 may be disposed adjacent to the 1-3 sub-pixel PIX1-3 and the 2-3 sub-pixel PIX2-3, respectively, in the second direction. The 1-2 sub-pixel PIX1-2 and the 2-2 sub-pixel PIX2-2 may be disposed adjacent to the 1-4 sub-pixel PIX1-4 and the 2-4 sub-pixel PIX2-4, respectively, in the second direction.

The sub-pixels PIX that emit light of the same color are disposed in the first direction. That is, the 1-1 sub-pixel PIX1-1 and the 2-1 sub-pixel PIX2-1 may be disposed in the first direction and the 1-2 sub-pixel PIX1-2 and the 2-2 sub-pixel PIX2-2 may be disposed in the first direction. Also, the 1-3 sub-pixel PIX1-3 and the 2-3 sub-pixel PIX2-3 may be disposed in the first direction and the 1-4 sub-pixel PIX1-4 and the 2-4 sub-pixel PIX2-4 may be disposed in the first direction.

In this case, the two sub-pixels PIX that emit light of different colors from each other are alternately disposed in sequence in the first direction. That is, the 1-1 sub-pixel PIX1-1 emitting light of the first color, the 1-2 sub-pixel PIX1-2 emitting light of the second color, the 2-1 sub-pixel PIX2-1 emitting light of the first color and the 2-2 sub-pixel PIX2-2 emitting light of the second color are disposed in sequence in the first direction. Also, the 1-3 sub-pixel PIX1-3 emitting light of the third color, the 1-4 sub-pixel PIX1-4 emitting light of the fourth color, the 2-3 sub-pixel PIX2-3 emitting light of the third color and the 2-4 sub-pixel PIX2-4 emitting light of the fourth color are disposed in sequence in the first direction.

The second area TA may include a 2-1 area and a 2-2 area on both sides, respectively, of the first area EA in the first direction.

The 2-1 area may include a 1-1 auxiliary sub-pixel APIX1-1, a 1-2 auxiliary sub-pixel APIX1-2, a 2-1 auxiliary sub-pixel APIX2-1 and a 2-2 auxiliary sub-pixel APIX2-2 disposed in sequence in the second direction.

The 1-1 auxiliary sub-pixel APIX1-1 may be disposed adjacent to the 1-1 sub-pixel PIX1-1 in the first direction. The 1-1 auxiliary sub-pixel APIX1-1 may be turned ON/OFF along with the 1-1 sub-pixel PIX1-1 in response to a signal of a 1-1 circuit unit C1-1 of the 1-1 sub-pixel PIX1-1. The 1-1 auxiliary sub-pixel APIX1-1 and the 1-1 sub-pixel PIX1-1 may emit light of the same first color.

The 1-2 auxiliary sub-pixel APIX1-2 may be disposed adjacent to the 1-2 sub-pixel PIX1-2 in the first direction. The 1-2 auxiliary sub-pixel APIX1-2 may be turned ON/OFF along with the 1-2 sub-pixel PIX1-2 in response to a signal of a 1-2 circuit unit C1-2 of the 1-2 sub-pixel PIX1-2. The 1-2 auxiliary sub-pixel APIX1-2 and the 1-2 sub-pixel PIX1-2 may emit light of the same second color.

The 2-1 auxiliary sub-pixel APIX2-1 may be disposed adjacent to the 2-1 sub-pixel PIX2-1 in the first direction. The 2-1 auxiliary sub-pixel APIX2-1 may be turned ON/OFF along with the 2-1 sub-pixel PIX2-1 in response to a signal of a 2-1 circuit unit C2-1 of the 2-1 sub-pixel PIX2-1. The 2-1 auxiliary sub-pixel APIX2-1 and the 2-1 sub-pixel PIX2-1 may emit light of the same first color.

The 2-2 auxiliary sub-pixel APIX2-2 may be disposed adjacent to the 2-2 sub-pixel PIX2-2 in the first direction. The 2-2 auxiliary sub-pixel APIX2-2 may be turned ON/OFF along with the 2-2 sub-pixel PIX2-2 in response to a signal of a 2-2 circuit unit C2-2 of the 2-2 sub-pixel PIX2-2. The 2-2 auxiliary sub-pixel APIX2-2 and the 2-2 sub-pixel PIX2-2 may emit light of the same second color.

The 2-2 area may include a 1-3 auxiliary sub-pixel APIX1-3, a 1-4 auxiliary sub-pixel APIX1-4, a 2-3 auxiliary sub-pixel APIX2-3 and a 2-4 auxiliary sub-pixel APIX2-4 disposed in sequence in the second direction.

The 1-3 auxiliary sub-pixel APIX1-3 may be disposed adjacent to the 1-3 sub-pixel PIX1-3 in the first direction. The 1-3 auxiliary sub-pixel APIX1-3 may be turned ON/OFF along with the 1-3 sub-pixel PIX1-3 in response to a signal of a 1-3 circuit unit C1-3 of the 1-3 sub-pixel PIX1-3. The 1-3 auxiliary sub-pixel APIX1-3 and the 1-3 sub-pixel PIX1-3 may emit light of the same third color.

The 1-4 auxiliary sub-pixel APIX1-4 may be disposed adjacent to the 1-4 sub-pixel PIX1-4 in the first direction. The 1-4 auxiliary sub-pixel APIX1-4 may be turned ON/OFF along with the 1-4 sub-pixel PIX1-4 in response to a signal of a 1-4 circuit unit C1-4 of the 1-4 sub-pixel PIX1-4. The 1-4 auxiliary sub-pixel APIX1-4 and the 1-4 sub-pixel PIX1-4 may emit light of the same fourth color.

The 2-3 auxiliary sub-pixel APIX2-3 may be disposed adjacent to the 2-3 sub-pixel PIX2-3 in the first direction. The 2-3 auxiliary sub-pixel APIX2-3 may be turned ON/OFF along with the 2-3 sub-pixel PIX2-3 in response to a signal of a 2-3 circuit unit C2-3 of the 2-3 sub-pixel PIX2-3. The 2-3 auxiliary sub-pixel APIX2-3 and the 2-3 sub-pixel PIX2-3 may emit light of the same third color.

The 2-4 auxiliary sub-pixel APIX2-4 may be disposed adjacent to the 2-4 sub-pixel PIX2-4 in the first direction. The 2-4 auxiliary sub-pixel APIX2-4 may be turned ON/OFF along with the 2-4 sub-pixel PIX2-4 in response to a signal of a 2-4 circuit unit C2-4 of the 2-4 sub-pixel PIX2-4. The 2-4 auxiliary sub-pixel APIX2-4 and the 2-4 sub-pixel PIX2-4 may emit light of the same fourth color.

Referring to FIG. 9, on the substrate SUB, the 1-1 sub-pixel PIX1-1 in the first area EA may be disposed adjacent to the 1-1 auxiliary sub-pixel APIX1-1 in the second area TA in the first direction. The 1-1 sub-pixel PIX1-1 may include an organic light emitting diode OLE1 that emits light of the first color and the 1-1 circuit unit C1-1 that drives the organic light emitting diode OLE1. The 1-1 auxiliary sub-pixel APIX1-1 may include an auxiliary organic light emitting diode OLE2 that emits light of the first color. The auxiliary organic light emitting diode OLE2 may be driven by the 1-1 circuit unit C1-1.

More specifically, the 1-1 circuit unit C1-1 may be located on the substrate SUB. The 1-1 circuit unit C1-1 may include at least one transistor and at least one capacitor. The passivation layer PAS and the overcoat layer OC may be formed in sequence on the substrate SUB on which the 1-1 circuit unit C1-1 has been formed. The overcoat layer OC may be patterned and removed from the second area TA.

On the overcoat layer OC and the passivation layer PAS, the organic light emitting diode OLE1 and the auxiliary organic light emitting diode OLE2 may be located. The organic light emitting diode OLE1 may include a 1-1 electrode E1-1, the second electrode E2, and the organic emission layer OL interposed between the 1-1 electrode E1-1 and the second electrode E2. The auxiliary organic light emitting diode OLE2 may include a 1-2 electrode E1-2, the second electrode E2, and the organic emission layer OL interposed between the 1-2 electrode E1-2 and the second electrode E2. That is, the organic light emitting diode OLE1 and the auxiliary organic light emitting diode OLE2 may share the organic emission layer OL and the second electrode E2.

The 1-1 electrode E1-1 may be electrically connected to the 1-1 circuit unit C1-1 through a contact hole penetrating the overcoat layer OC and the passivation layer PAS. The 1-1 electrode E1-1 may have a structure in which the transparent conductive layer TE and the reflective layer ME are laminated in sequence. The sequence of laminating the transparent conductive layer TE and the reflective layer ME can be changed. The reflective layer ME may be disposed only in the first area EA. The first area EA in which the organic light emitting diode OLE1 has been formed includes the reflective layer ME. Therefore, the first area EA can function as an emission area but cannot function as a transmission area.

The 1-2 electrode E1-2 may be a part of the transparent conductive layer TE extended from the 1-1 electrode E1-1. That is, the 1-1 electrode E1-1 and the 1-2 electrode E1-2 may share the transparent conductive layer TE. The 1-2 electrode E1-2 may be a transparent electrode formed of only a transparent conductive layer. The second area TA in which the auxiliary organic light emitting diode OLE2 has been formed includes the 1-2 electrode E1-2 which is a transparent electrode. Therefore, the second area TA can function as an emission area while the display device is driven and can also function as a transmission area while the display device is not driven.

The 1-1 sub-pixel PIX1-1 and the 1-1 auxiliary sub-pixel APIX1-1 may be partitioned by the bank layer BN. That is, the bank layer BN may be located on the edge of the reflective layer ME between the 1-1 sub-pixel PIX1-1 and the 1-1 auxiliary sub-pixel APIX1-1.

For another example, as shown in FIG. 10, the 1-1 sub-pixel PIX1-1 and the 1-1 auxiliary sub-pixel APIX1-1 may not be partitioned by the bank layer BN. That is, the bank layer BN may not be located between the 1-1 sub-pixel PIX1-1 and the 1-1 auxiliary sub-pixel APIX1-1. In this case, the aperture ratio can be further improved. On the substrate SUB on which the bank layer BN has been formed, the organic emission layer OL and the second electrode E2 may be located in sequence.

As described above, the display device according to the second aspect of the present disclosure includes the second area TA which is a light transmission area. Thus, the display device can function as a transparent display device and supply light for displaying input images in the second area TA as well as in the first area EA. Therefore, a sufficient aperture ratio can be secured. Therefore, it is possible to provide a high-quality transparent display device.

Also, the display device according to the second aspect of the present disclosure satisfies a required aperture ratio. Also, the display device controls the sizes of the first area EA and the second area TA depending on the desired luminance, efficiency of an organic light emitting diode and transmittance. For example, if an improvement in transmittance is needed, the size of the first area EA can be reduced by controlling the size of the reflective layer ME to relatively increase the size of the second area TA. Therefore, according to the second aspect of the present disclosure, it is possible to provide a transparent display device with a remarkably improved degree of design freedom.

A configuration aspect of a 1-1 sub-pixel and a 1-1 auxiliary sub-pixel has been described above. Although not illustrated in the drawing, the structure shown in FIG. 9 can be equally applied to each of the 1-2 sub-pixel PIX1-2 and the 1-2 auxiliary sub-pixel APIX1-2, the 1-3 sub-pixel PIX1-3 and the 1-3 auxiliary sub-pixel APIX1-3, the 1-4 sub-pixel PIX1-4 and the 1-4 auxiliary sub-pixel APIX1-4, the 2-1 sub-pixel PIX2-1 and the 2-1 auxiliary sub-pixel APIX2-1, the 2-2 sub-pixel PIX2-2 and the 2-2 auxiliary sub-pixel APIX2-2, the 2-3 sub-pixel PIX2-3 and the 2-3 auxiliary sub-pixel APIX2-3, and the 2-4 sub-pixel PIX2-4 and the 2-4 auxiliary sub-pixel APIX2-4.

Figure 11:
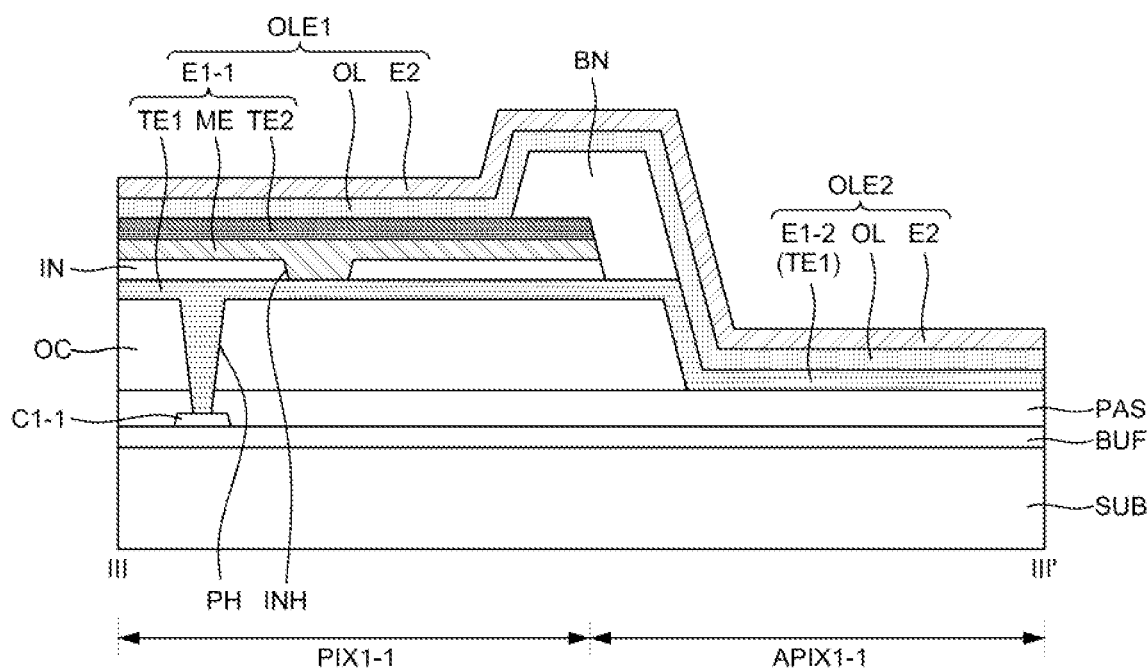
FIG. 11 is a cross-sectional view as taken along line of FIG. 8 according to a first modification aspect of the second aspect.

FIG. 11 is a cross-sectional view as taken along line of FIG. 8 according to a first modification aspect of the second aspect.

Referring to FIG. 11, on the substrate SUB, the 1-1 sub-pixel PIX1-1 in the first area EA may be disposed adjacent to the 1-1 auxiliary sub-pixel APIX1-1 in the second area TA in the first direction. The 1-1 sub-pixel PIX1-1 may include the organic light emitting diode OLE1 that emits light of the first color and the 1-1 circuit unit C1-1 that drives the organic light emitting diode OLE1. The 1-1 auxiliary sub-pixel APIX1-1 may include the auxiliary organic light emitting diode OLE2 that emits light of the first color. The auxiliary organic light emitting diode OLE2 may be driven by the 1-1 circuit unit C1-1.

More specifically, the 1-1 circuit unit C1-1 may be located on the substrate SUB. The 1-1 circuit unit C1-1 may include at least one transistor and at least one capacitor. The passivation layer PAS and the overcoat layer OC may be formed in sequence on the substrate SUB on which the 1-1 circuit unit C1-1 has been formed. The overcoat layer OC may be patterned and removed from the second area TA.

On the overcoat layer OC and the passivation layer PAS, the organic light emitting diode OLE1 and the auxiliary organic light emitting diode OLE2 may be located. The organic light emitting diode OLE1 may include the 1-1 electrode E1-1, the second electrode E2, and the organic emission layer OL interposed between the 1-1 electrode E1-1 and the second electrode E2. The auxiliary organic light emitting diode OLE2 may include the 1-2 electrode E1-2, the second electrode E2, and the organic emission layer OL interposed between the 1-2 electrode E1-2 and the second electrode E2. That is, the organic light emitting diode OLE1 and the auxiliary organic light emitting diode OLE2 may share the organic emission layer OL and the second electrode E2.

The 1-1 electrode E1-1 may be electrically connected to the 1-1 circuit unit C1-1 through the pixel contact hole PH penetrating the overcoat layer OC and the passivation layer PAS. For example, the first transparent conductive layer TE1 included in the 1-1 electrode E1-1 may be electrically connected to the 1-1 circuit unit C1-1 through the pixel contact hole PH.

The 1-1 electrode E1-1 may have a structure in which the first transparent conductive layer TE1, the reflective layer ME and the second transparent conductive layer TE2 are laminated in sequence. An intermediate insulating layer IN may be interposed between the first transparent conductive layer TE1 and the reflective layer ME. The first transparent conductive layer TE1 may be connected to the reflective layer ME through an open hole INH penetrating the intermediate insulating layer IN. The intermediate insulating layer IN, the reflective layer ME and the second transparent conductive layer TE2 may be disposed only in the first area EA. The first area EA in which the organic light emitting diode OLE1 has been formed includes the reflective layer ME. Therefore, the first area EA can function as an emission area but cannot function as a transmission area.

The 1-2 electrode E1-2 may be a part of the first transparent conductive layer TE1 extended from the 1-1 electrode E1-1. That is, the 1-1 electrode E1-1 and the 1-2 electrode E1-2 may share the first transparent conductive layer TE1. The 1-2 electrode E1-2 may be a transparent electrode formed of only a transparent conductive layer. The second area TA in which the auxiliary organic light emitting diode OLE2 has been formed includes the 1-2 electrode E1-2 which is a transparent electrode. Therefore, the second area TA can function as an emission area while the display device is driven and can also function as a transmission area while the display device is not driven.

The 1-1 sub-pixel PIX1-1 and the 1-1 auxiliary sub-pixel APIX1-1 may be partitioned by the bank layer BN. That is, the bank layer BN may be located on the edges of the intermediate insulating layer IN, the reflective layer ME and the second transparent conductive layer TE2 between the 1-1 sub-pixel PIX1-1 and the 1-1 auxiliary sub-pixel APIX1-1. The bank layer BN may include an opening through which the second transparent conductive layer TE2 in the first area EA and the first transparent conductive layer TE1 in the second area TA are exposed.

For another example, the 1-1 sub-pixel PIX1-1 and the 1-1 auxiliary sub-pixel APIX1-1 may not be partitioned by the bank layer BN. That is, the bank layer BN may not be located between the 1-1 sub-pixel PIX1-1 and the 1-1 auxiliary sub-pixel APIX1-1. In this case, the aperture ratio can be further improved.

On the substrate SUB on which the bank layer BN has been formed, the organic emission layer OL and the second electrode E2 may be located in sequence.

A configuration aspect of a 1-1 sub-pixel and a 1-1 auxiliary sub-pixel has been described above. Although not illustrated in the drawing, the structure shown in FIG. 11 can be equally applied to each of the 1-2 sub-pixel PIX1-2 and the 1-2 auxiliary sub-pixel APIX1-2, the 1-3 sub-pixel PIX1-3 and the 1-3 auxiliary sub-pixel APIX1-3, the 1-4 sub-pixel PIX1-4 and the 1-4 auxiliary sub-pixel APIX1-4, the 2-1 sub-pixel PIX2-1 and the 2-1 auxiliary sub-pixel APIX2-1, the 2-2 sub-pixel PIX2-2 and the 2-2 auxiliary sub-pixel APIX2-2, the 2-3 sub-pixel PIX2-3 and the 2-3 auxiliary sub-pixel APIX2-3, and the 2-4 sub-pixel PIX2-4 and the 2-4 auxiliary sub-pixel APIX2-4.

FIG. 12A through FIG. 12E illustrate a process of forming an organic light emitting diode and an auxiliary organic light emitting diode in a structure of FIG. 11 in a time-sequential manner.

Figure 12A:
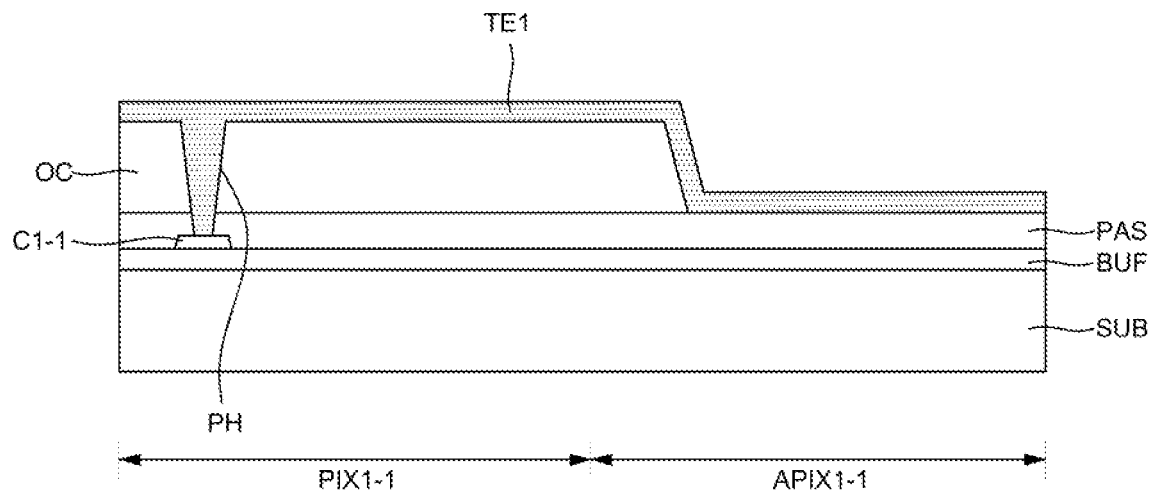
FIG. 12A through FIG. 12E illustrate a process of forming an organic light emitting diode and an auxiliary organic light emitting diode in a structure of FIG. 11 in a time-sequential manner.

Referring to FIG. 12A, a first transparent conductive material is coated on the substrate on which the overcoat layer OC has been formed and patterned through wet etching to form the first transparent conductive layer TE1. The first transparent conductive layer TE1 may be formed as one body on a region (hereinafter, referred to as "1-1 sub-pixel PIX1-1 region") corresponding to the 1-1 sub-pixel PIX1-1 in the first area EA and a region (hereinafter, referred to as "1-1 auxiliary sub-pixel APIX1-1 region") corresponding to the 1-1 auxiliary sub-pixel APIX1-1 in the second area TA. The first transparent conductive material may be ITO but may not be limited thereto. The first transparent conductive layer TE1 may be electrically connected to the 1-1 circuit unit C1-1 in the first area EA through the pixel contact hole PH penetrating the overcoat layer OC and the passivation layer PAS.

Figure 12B:
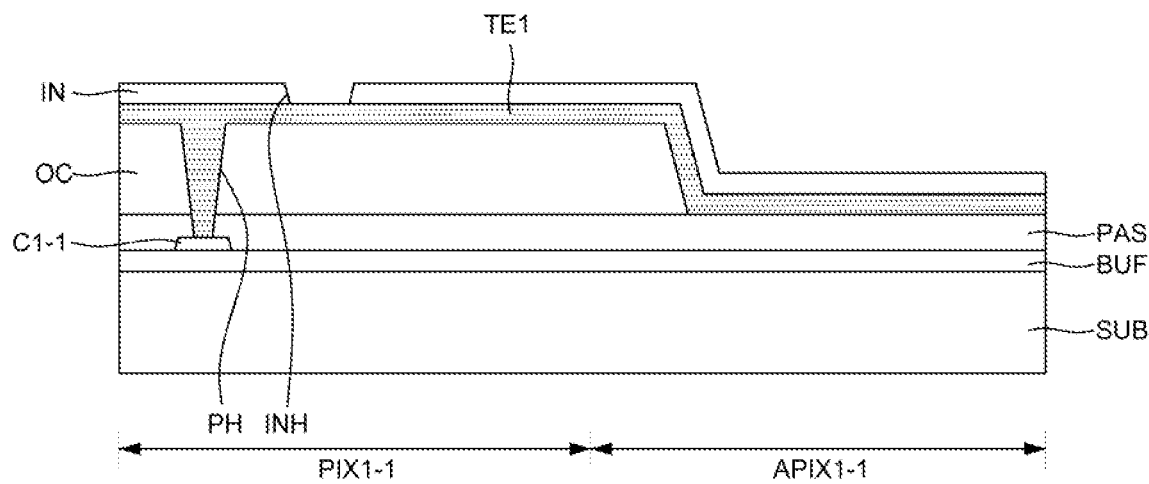

Referring to FIG. 12B, an inorganic insulating material is coated on the substrate on which the first transparent conductive layer TE1 has been formed. Then, the inorganic insulating material is patterned through dry etching to form the open hole INH through which at least a part of the first transparent conductive layer TE1 is exposed. The inorganic insulating material may be silicon oxide (SiOx) but may not be limited thereto. The open hole INH is formed by patterning the inorganic insulating material through dry etching, and, thus, the first transparent conductive layer TE1 may not be patterned.

Figure 12C:
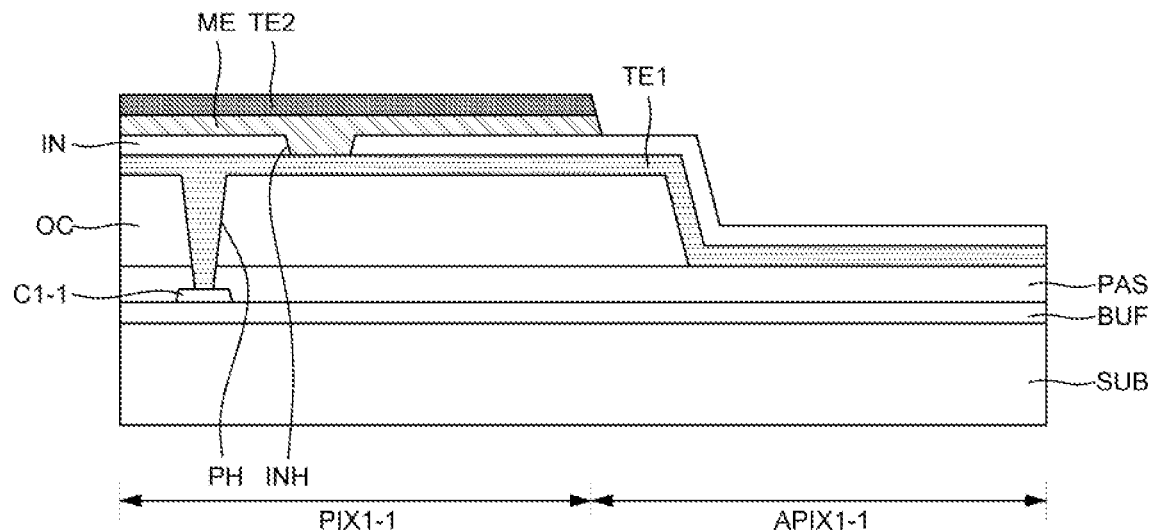

Referring to FIG. 12C, a metal material and a second transparent conductive material are coated in sequence on the inorganic insulating material. Then, the metal material and the second transparent conductive material are patterned through wet etching to form the reflective layer ME and the second transparent conductive layer TE2. The reflective layer ME and the second transparent conductive layer TE2 may be located only on the 1-1 sub-pixel PIX1-1 region. The reflective layer ME may be electrically connected to the first transparent conductive layer TE1 through the open hole INH. The metal material may be molytitanium (MoTi) and the second transparent conductive material may be ITO but may not be limited thereto. The metal material and the second transparent conductive material are patterned through wet etching, and, thus, the inorganic insulating material may not be patterned. Therefore, it is possible to suppress damage to the first transparent conductive layer TE1 located under the inorganic insulating material during wet etching for forming the reflective layer ME and the second transparent conductive layer TE2.

Figure 12D:
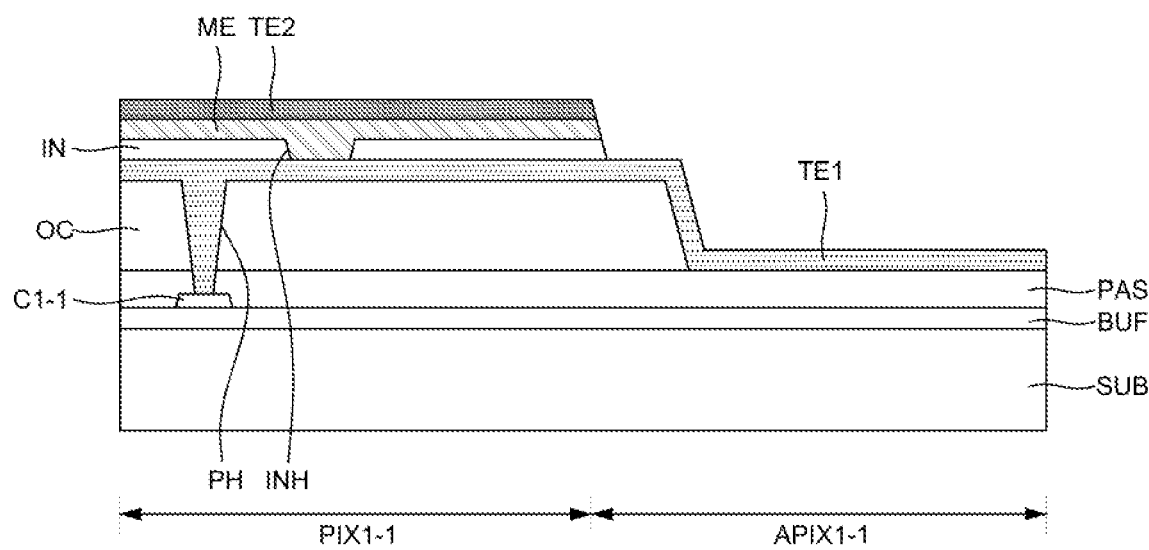

Referring to FIG. 12D, after the reflective layer ME and the second transparent conductive layer TE2 are formed, the inorganic insulating material is patterned through dry etching to form the intermediate insulating layer IN. During dry etching, only a part of the inorganic insulating material located under the reflective layer ME and the second transparent conductive layer TE2 and masked by the reflective layer ME and the second transparent conductive layer TE2 can remain on the first transparent conductive layer TE1. After dry etching, a part of the remaining inorganic insulating material may be referred to as the intermediate insulating layer IN. The intermediate insulating layer IN may be located only on the 1-1 sub-pixel PIX1-1 region and interposed between the first transparent conductive layer TE1 and the reflective layer ME. Since the inorganic insulating material is patterned, a part of the first transparent conductive layer TE1 corresponding to the 1-1 auxiliary sub-pixel APIX1-1 region may be exposed.

Figure 12E:
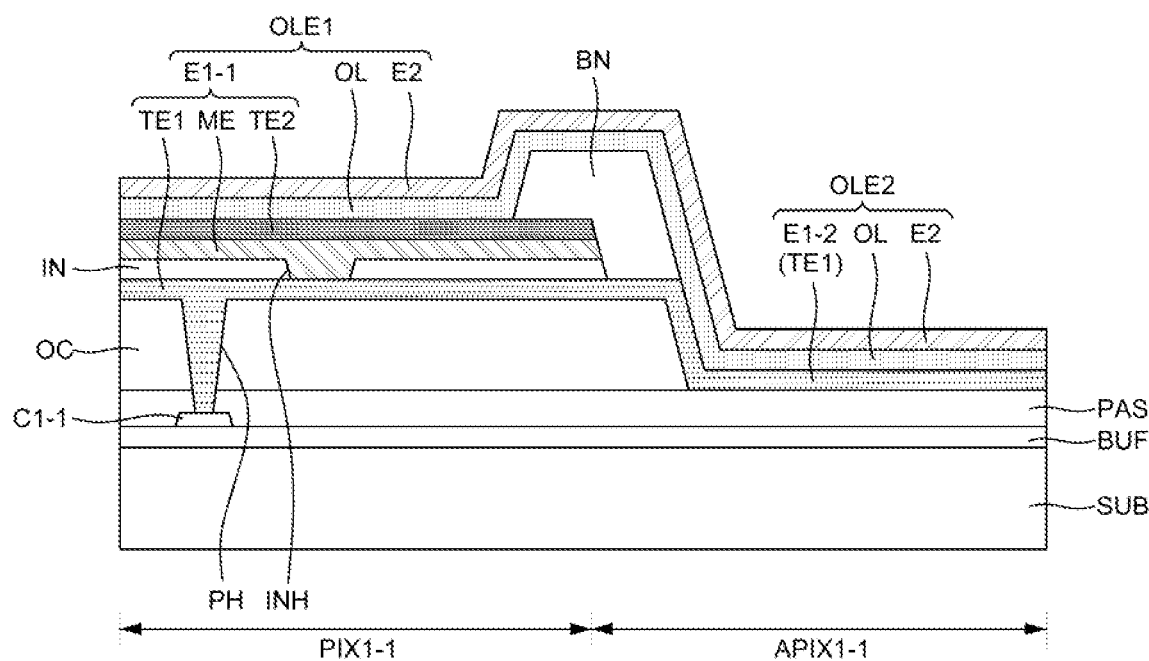

Referring to FIG. 12E, the bank layer BN for partitioning the 1-1 sub-pixel PIX1-1 region and the 1-1 auxiliary sub-pixel APIX1-1 region is formed. The bank layer BN includes an opening. The opening may expose the second transparent conductive layer TE2 in the 1-1 sub-pixel PIX1-1 region and the first transparent conductive layer TE1 in the 1-1 auxiliary sub-pixel APIX1-1 region. On the substrate SUB on which the bank layer BN has been formed, the organic emission layer OL and the second electrode E2 are formed in sequence.

The first transparent conductive layer TE1, the reflective layer ME and the second transparent conductive layer TE2 located on the 1-1 sub-pixel PIX1-1 region may be referred to as the 1-1 electrode E1-1. Also, they may form the organic light emitting diode OLE1 together with the organic emission layer OL and the second electrode E2. The first transparent conductive layer TE1 located on the 1-1 auxiliary sub-pixel APIX1-1 region may be referred to as the 1-2 electrode E1-2. Also, it may form the auxiliary organic light emitting diode OLE2 together with the organic emission layer OL and the second electrode E2.

Figure 13:
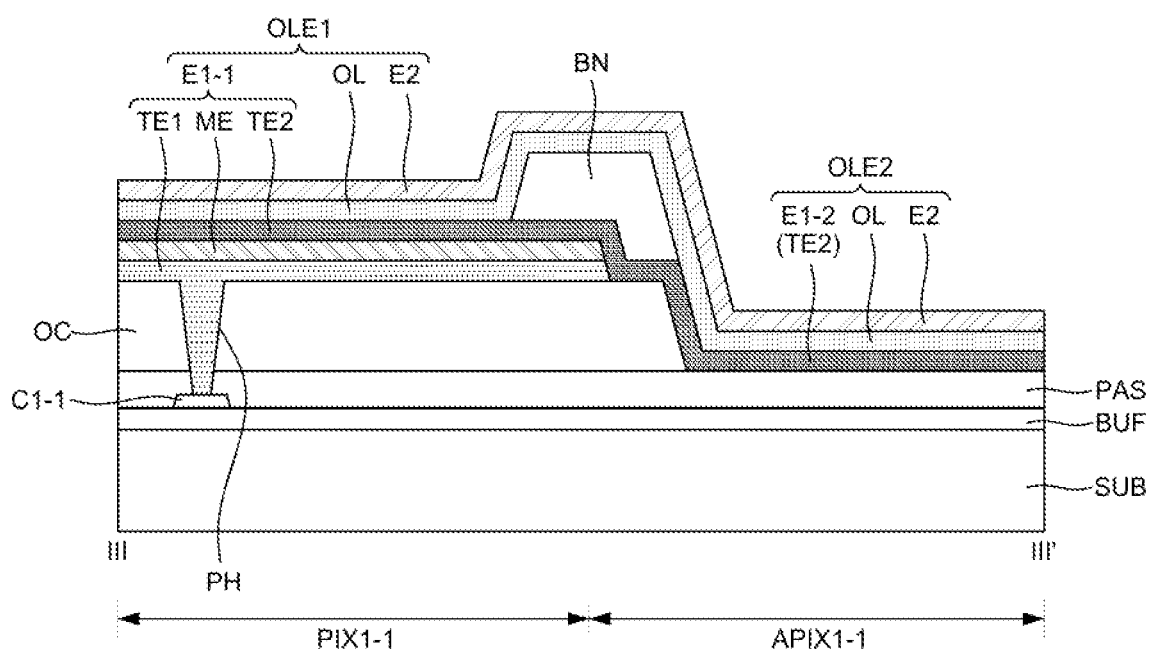
FIG. 13 is a cross-sectional view as taken along line of FIG. 8 according to a second modification aspect of the second aspect.

FIG. 13 is a cross-sectional view as taken along line of FIG. 8 according to a second modification aspect of the second aspect.

Referring to FIG. 13, on the substrate SUB, the 1-1 sub-pixel PIX1-1 in the first area EA may be disposed adjacent to the 1-1 auxiliary sub-pixel APIX1-1 in the second area TA in the first direction. The 1-1 sub-pixel PIX1-1 may include the organic light emitting diode OLE1 that emits light of the first color and the 1-1 circuit unit C1-1 that drives the organic light emitting diode OLE1. The 1-1 auxiliary sub-pixel APIX1-1 may include the auxiliary organic light emitting diode OLE2 that emits light of the first color. The auxiliary organic light emitting diode OLE2 may be driven by the 1-1 circuit unit C1-1.

More specifically, the 1-1 circuit unit C1-1 may be located on the substrate SUB. The 1-1 circuit unit C1-1 may include at least one transistor and at least one capacitor. The passivation layer PAS and the overcoat layer OC may be formed in sequence on the substrate SUB on which the 1-1 circuit unit C1-1 has been formed. The overcoat layer OC may be patterned and removed from the second area TA.

On the overcoat layer OC and the passivation layer PAS, the organic light emitting diode OLE1 and the auxiliary organic light emitting diode OLE2 may be located. The organic light emitting diode OLE1 may include the 1-1 electrode E1-1, the second electrode E2, and the organic emission layer OL interposed between the 1-1 electrode E1-1 and the second electrode E2. The auxiliary organic light emitting diode OLE2 may include the 1-2 electrode E1-2, the second electrode E2, and the organic emission layer OL interposed between the 1-2 electrode E1-2 and the second electrode E2. That is, the organic light emitting diode OLE1 and the auxiliary organic light emitting diode OLE2 may share the organic emission layer OL and the second electrode E2.

The 1-1 electrode E1-1 may be electrically connected to the 1-1 circuit unit C1-1 through the pixel contact hole PH penetrating the overcoat layer OC and the passivation layer PAS. For example, the first transparent conductive layer TE1 included in the 1-1 electrode E1-1 may be electrically connected to the 1-1 circuit unit C1-1 through the pixel contact hole PH.

The 1-1 electrode E1-1 may have a structure in which the first transparent conductive layer TE1, the reflective layer ME and the second transparent conductive layer TE2 are laminated in sequence. The first transparent conductive layer TE1 and the reflective layer ME may be disposed only in the first area EA. The first area EA in which the organic light emitting diode OLE1 has been formed includes the reflective layer ME. Therefore, the first area EA can function as an emission area but cannot function as a transmission area.

The 1-2 electrode E1-2 may be a part of the second transparent conductive layer TE2 extended from the 1-1 electrode E1-1. That is, the 1-1 electrode E1-1 and the 1-2 electrode E1-2 may share the second transparent conductive layer TE2. The 1-2 electrode E1-2 may be a transparent electrode formed of only a transparent conductive layer. The second area TA in which the auxiliary organic light emitting diode OLE2 has been formed includes the 1-2 electrode E1-2 which is a transparent electrode. Therefore, the second area TA can function as an emission area while the display device is driven and can also function as a transmission area while the display device is not driven.

The 1-1 sub-pixel PIX1-1 and the 1-1 auxiliary sub-pixel APIX1-1 may be partitioned by the bank layer BN. That is, the bank layer BN may be located on the edges of the first transparent conductive layer TE1 and the reflective layer ME between the 1-1 sub-pixel PIX1-1 and the 1-1 auxiliary sub-pixel APIX1-1. The bank layer BN may include an opening through which the second transparent conductive layer TE2 in the first area EA and the second transparent conductive layer TE2 in the second area TA are exposed.

For another example, the 1-1 sub-pixel PIX1-1 and the 1-1 auxiliary sub-pixel APIX1-1 may not be partitioned by the bank layer BN. That is, the bank layer BN may not be located between the 1-1 sub-pixel PIX1-1 and the 1-1 auxiliary sub-pixel APIX1-1. In this case, the aperture ratio can be further improved.

On the substrate SUB on which the bank layer BN has been formed, the organic emission layer OL and the second electrode E2 may be located in sequence.

A configuration aspect of a 1-1 sub-pixel and a 1-1 auxiliary sub-pixel has been described above. Although not illustrated in the drawing, the structure shown in FIG. 13 can be equally applied to each of the 1-2 sub-pixel PIX1-2 and the 1-2 auxiliary sub-pixel APIX1-2, the 1-3 sub-pixel PIX1-3 and the 1-3 auxiliary sub-pixel APIX1-3, the 1-4 sub-pixel PIX1-4 and the 1-4 auxiliary sub-pixel APIX1-4, the 2-1 sub-pixel PIX2-1 and the 2-1 auxiliary sub-pixel APIX2-1, the 2-2 sub-pixel PIX2-2 and the 2-2 auxiliary sub-pixel APIX2-2, the 2-3 sub-pixel PIX2-3 and the 2-3 auxiliary sub-pixel APIX2-3, and the 2-4 sub-pixel PIX2-4 and the 2-4 auxiliary sub-pixel APIX2-4.

Figure 14A:
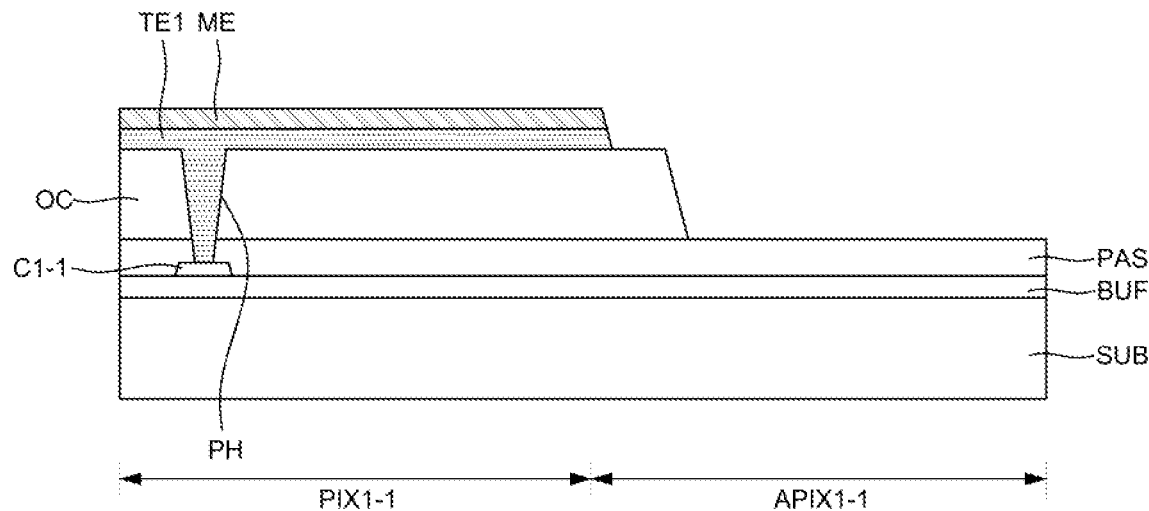
FIG. 14A through FIG. 14C illustrate a process of forming an organic light emitting diode and an auxiliary organic light emitting diode in a structure of FIG. 13 in a time-sequential manner.
Figure 14B:
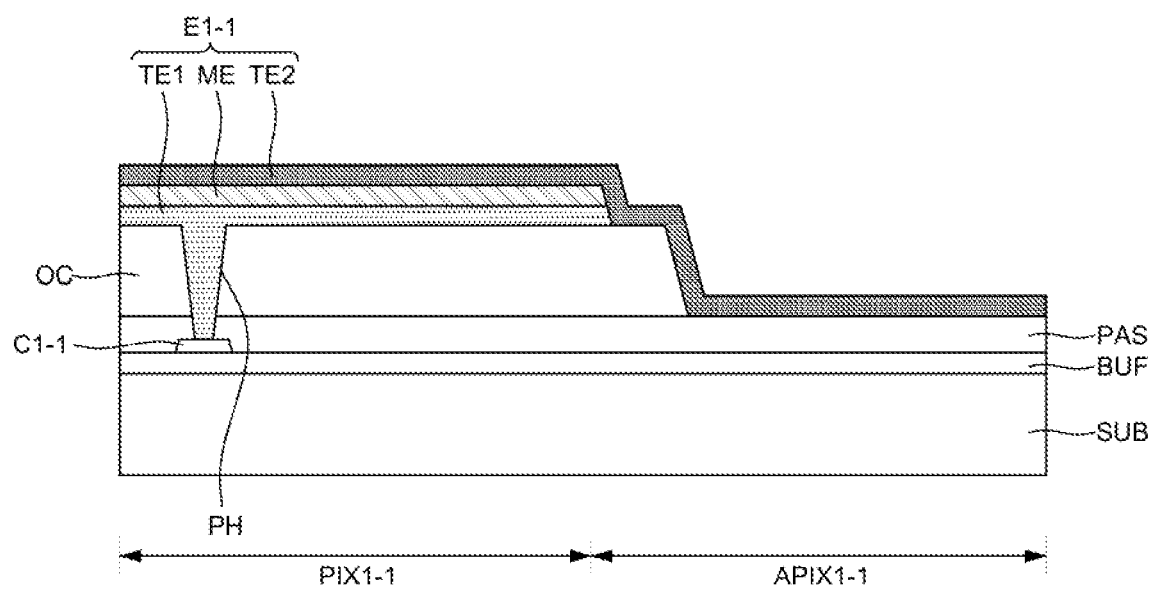
Figure 14C:
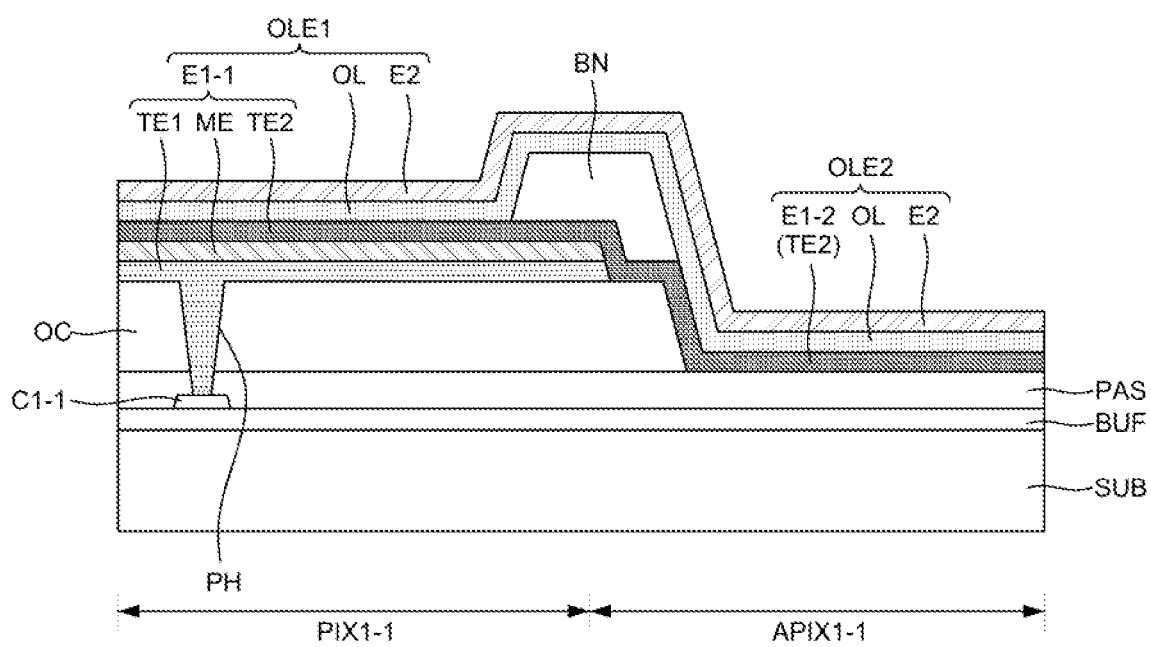

FIG. 14A through FIG. 14C illustrate a process of forming an organic light emitting diode and an auxiliary organic light emitting diode in a structure of FIG. 13 in a time-sequential manner.

Referring to FIG. 14A, a first transparent conductive material and a metal material are coated on the substrate on which the overcoat layer OC has been formed. Then, the first transparent conductive material and the metal material are patterned through wet etching to form the first transparent conductive layer TE1 and the reflective layer ME. The first transparent conductive layer TE1 and the reflective layer ME may be located only on the 1-1 sub-pixel PIX1-1 region. The first transparent conductive material may be ITO and the metal material may be molytitanium (MoTi) but may not be limited thereto. The first transparent conductive layer TE1 may be electrically connected to the 1-1 circuit unit C1-1 in the first area EA through the pixel contact hole PH penetrating the overcoat layer OC and the passivation layer PAS.

Referring to FIG. 14B, a second transparent conductive material is coated on the substrate SUB on which the first transparent conductive layer TE1 and the reflective layer ME have been formed. Then, the second transparent conductive material is patterned through wet etching to form the second transparent conductive layer TE2. The second transparent conductive layer TE2 may be formed as one body on the 1-1 sub-pixel PIX1-1 region and the 1-1 auxiliary sub-pixel APIX1-1 region. The second transparent conductive material may be ITO but may not be limited thereto.

Referring to FIG. 14C, the bank layer BN for partitioning the 1-1 sub-pixel PIX1-1 region and the 1-1 auxiliary sub-pixel APIX1-1 region is formed. The bank layer BN includes an opening. The opening may expose a part of the second transparent conductive layer TE2 in the 1-1 sub-pixel PIX1-1 region and a part of the second transparent conductive layer TE2 in the 1-1 auxiliary sub-pixel APIX1-1 region. On the substrate SUB on which the bank layer BN has been formed, the organic emission layer OL and the second electrode E2 are formed in sequence.

The first transparent conductive layer TE1, the reflective layer ME and the second transparent conductive layer TE2 located on the 1-1 sub-pixel PIX1-1 region may be referred to as the 1-1 electrode E1-1. Also, they may form the organic light emitting diode OLE1 together with the organic emission layer OL and the second electrode E2. The second transparent conductive layer TE2 located on the 1-1 auxiliary sub-pixel APIX1-1 region may be referred to as the 1-2 electrode E1-2. Also, it may form the auxiliary organic light emitting diode OLE2 together with the organic emission layer OL and the second electrode E2.

It will be understood by a person with ordinary skill in the art that various changes and modifications may be applicable within a range not departing from the technical idea of the present disclosure. Accordingly, the technical scope of the present disclosure is not limited to the detailed description of the specification but should be defined by the accompanying claims.

What is claimed is:

1. A transparent display device, comprising:
a substrate including an emission area where a sub-pixel having an organic light emitting diode are disposed, and a transmission area where an auxiliary sub-pixel adjacent to the sub-pixel and having an auxiliary organic light emitting diode are disposed,
wherein the organic light emitting diode includes a 1-1 electrode in which a first transparent conductive layer, a reflective layer, a second transparent conductive layer and an intermediate insulating layer which is interposed between the reflective layer and the second transparent conductive layer,
wherein the first transparent conductive layer, the reflective layer and the intermediate insulating layer are disposed in the emission area, and the second transparent conductive layer is disposed to extend from the emission area to the transmission area,
wherein the auxiliary organic light emitting diode includes a 1-2 electrode in which the second transparent conductive layer is extended and provided, and
wherein the auxiliary organic light emitting diode are arranged to correspond to an entire transmission area.

2. The transparent display device according to claim 1, wherein the first transparent conductive layer is located on the reflective layer in the emission area, and
wherein the second transparent conductive layer is located under the reflective layer in the emission area.

3. The transparent display device according to claim 2, wherein the reflective layer and the second transparent conductive layer are connected to each other in the emission area through an open hole penetrating the intermediate insulating layer.

4. The transparent display device according to claim 3, wherein the intermediate insulating layer is located only in the emission area.

5. The transparent display device according to claim 4, further comprising a passivation layer and an overcoat layer laminated between a circuit unit and the second transparent conductive layer,
wherein the overcoat layer is removed from the transmission area.

6. The transparent display device according to claim 5, wherein the second transparent conductive layer is in contact with the overcoat layer in the emission area and with the passivation layer in the transmission area.

7. The transparent display device according to claim 1, wherein the first transparent conductive layer is located under the reflective layer in the emission area, and wherein the second transparent conductive layer is located on the reflective layer in the emission area.

8. The transparent display device according to claim 7, further comprising a passivation layer and an overcoat layer laminated between a circuit unit and the second transparent conductive layer, wherein the overcoat layer is removed from the transmission area.

9. The transparent display device according to claim 8, wherein the second transparent conductive layer is in contact with the reflective layer in the emission area and with the passivation layer in the transmission area.

10. A transparent display device having a sub-pixel and an auxiliary sub-pixel adjacent to each other, comprising:

an organic light emitting diode of the sub-pixel disposed in the emission area and including a first-main electrode that has a first transparent conductive layer, a reflective layer, a second transparent conductive layer and an intermediate insulating layer which is interposed between the reflective layer and the second transparent conductive layer, and an auxiliary organic light emitting diode of the auxiliary sub-pixel disposed in the transmission area, and including a portion of the second transparent conductive layer extended from the first main electrode that constitutes a first-auxiliary electrode, an organic emission layer located on the first-main electrode and the first-auxiliary electrode and shared by the organic light emitting diode and the auxiliary organic light emitting diode; and a second electrode disposed on the organic emission layer, wherein the auxiliary organic light emitting diode are arranged to correspond to an entire transmission area.

11. The transparent display device according to claim 10, wherein the first transparent conductive layer is located on the reflective layer in the emission area, and wherein the second transparent conductive layer is located under the reflective layer in the emission area.

12. The transparent display device according to claim 11, wherein the reflective layer and the second transparent conductive layer are connected to each other in the emission area through an open hole penetrating the intermediate insulating layer.

13. The transparent display device according to claim 1, further comprising a bank layer disposed between the emission area and the transmission area.

14. The transparent display device according to claim 1, wherein the emission area and the transmission area are adjacent to each other in the horizontal direction.

15. The transparent display device according to claim 14, wherein the transmission area is an area where signal lines area not disposed.

* * * * *